(12) United States Patent
Kume

(10) Patent No.: US 12,394,482 B2
(45) Date of Patent: Aug. 19, 2025

(54) SEMICONDUCTOR MEMORY DEVICE AND MANUFACTURING METHOD THEREOF

(71) Applicant: Kioxia Corporation, Tokyo (JP)

(72) Inventor: Ippei Kume, Mie (JP)

(73) Assignee: KIOXIA CORPORATION, Tokyo (JP)

( * ) Notice: Subject to any disclaimer, the term of this patent is extended or adjusted under 35 U.S.C. 154(b) by 533 days.

(21) Appl. No.: 17/687,085

(22) Filed: Mar. 4, 2022

(65) Prior Publication Data

US 2023/0088551 A1 Mar. 23, 2023

(30) Foreign Application Priority Data

Sep. 17, 2021 (JP) ................................. 2021-152185

(51) Int. Cl.
| | |
|---|---|
| *H01L 27/11524* | (2017.01) |
| *G11C 16/04* | (2006.01) |
| *H10B 41/20* | (2023.01) |
| *H10B 41/35* | (2023.01) |
| *H10B 43/20* | (2023.01) |
| *H10B 43/35* | (2023.01) |

(52) U.S. Cl.
CPC ......... *G11C 16/0483* (2013.01); *H10B 41/20* (2023.02); *H10B 41/35* (2023.02); *H10B 43/20* (2023.02); *H10B 43/35* (2023.02)

(58) Field of Classification Search
CPC .... G11C 16/0483; H10B 41/20; H10B 41/35; H10B 43/20; H10B 43/35; H10B 43/27; H10B 80/00; H01L 24/08
See application file for complete search history.

(56) References Cited

U.S. PATENT DOCUMENTS

| | | | | |
|---|---|---|---|---|
| 9,502,471 | B1* | 11/2016 | Lu | H10B 43/50 |
| 10,600,802 | B2* | 3/2020 | Nakamura | H01L 29/1037 |
| 10,727,244 | B2* | 7/2020 | Hwang | H10B 43/35 |
| 10,998,301 | B2* | 5/2021 | Kanamori | H01L 24/08 |
| 11,049,847 | B2* | 6/2021 | Kanamori | H01L 24/08 |
| 11,171,116 | B2* | 11/2021 | Park | H10B 43/30 |
| 11,238,934 | B2* | 2/2022 | Nam | H01L 25/0657 |
| 11,289,467 | B2* | 3/2022 | Kwon | G11C 16/30 |
| 11,302,396 | B2* | 4/2022 | Kwon | G11C 16/0483 |

(Continued)

FOREIGN PATENT DOCUMENTS

| | | |
|---|---|---|
| CN | 110299364 A | 10/2019 |
| JP | 2020-157165 A | 10/2020 |

(Continued)

*Primary Examiner* — Jarrett J Stark
(74) *Attorney, Agent, or Firm* — Foley & Lardner LLP

(57) ABSTRACT

According to one embodiment, a semiconductor memory device includes: a first chip including first conductive layers arranged at intervals in a first direction, a first semiconductor layer extending through an inside of the first conductive layers in the first direction, a first insulating film between the first semiconductor layer and the first conductive layers, a second semiconductor layer provided above the first conductive layers and in contact with the first semiconductor layer, and a first electrode provided in contact with an upper side of the second semiconductor layer; and a second chip including a second electrode in contact with the first electrode, and a second conductive layer in contact with the second electrode.

20 Claims, 23 Drawing Sheets

(56) References Cited

U.S. PATENT DOCUMENTS

| | | | |
|---|---|---|---|
| 11,315,639 B2* | 4/2022 | Oh | G11C 16/24 |
| 11,574,917 B2* | 2/2023 | Liu | H10B 41/27 |
| 11,721,727 B2* | 8/2023 | Baraskar | H10B 43/40 |
| 11,823,888 B2* | 11/2023 | Lee | H01L 24/08 |
| 11,910,616 B2* | 2/2024 | Lin | H01L 29/40111 |
| 2017/0154868 A1 | 6/2017 | Jo | |
| 2019/0295985 A1 | 9/2019 | Kawasaki | |
| 2021/0082877 A1 | 3/2021 | Uchiyama | |
| 2021/0082896 A1 | 3/2021 | Harashima et al. | |
| 2021/0151404 A1 | 5/2021 | Kim | |
| 2021/0288038 A1 | 9/2021 | Oga et al. | |
| 2021/0305273 A1* | 9/2021 | Lee | H10B 43/27 |

FOREIGN PATENT DOCUMENTS

| | | | |
|---|---|---|---|
| JP | 2021-048249 A | 3/2021 | |
| TW | 202111928 A | 3/2021 | |
| TW | 202135234 A | 9/2021 | |

* cited by examiner

SEMICONDUCTOR MEMORY DEVICE AND MANUFACTURING METHOD THEREOF

CROSS-REFERENCE TO RELATED APPLICATION(S)

This application is based upon and claims the benefit of priority from Japanese Patent Application No. 2021-152185, filed Sep. 17, 2021, the entire contents of which are incorporated herein by reference.

FIELD

Embodiments described herein relate generally to a semiconductor memory device.

BACKGROUND

A NAND-type flash memory has been known in which memory cells are three-dimensionally arranged.

DETAILED DESCRIPTION

Figure 1:
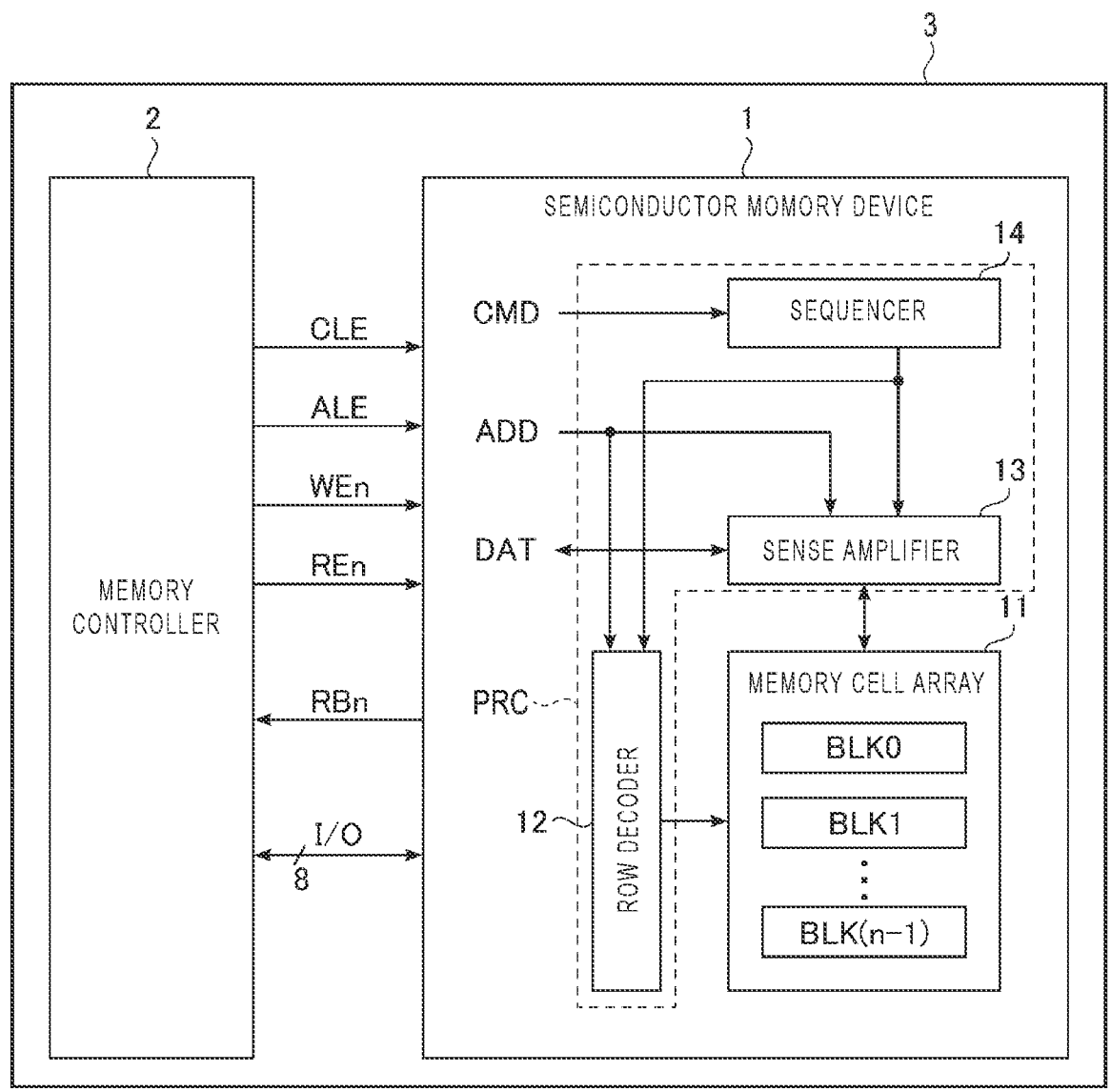
FIG. 1 is a block diagram illustrating an example of the configuration of a semiconductor memory device according to a first embodiment.

Embodiments provide a semiconductor memory device whose manufacturing process is simplified.

In general, according to at least one embodiment, a semiconductor memory device includes: a first chip including first conductive layers arranged at intervals in a first direction, a first semiconductor layer extending through an inside of the first conductive layers in the first direction, a first insulating film between the first semiconductor layer and the first conductive layers, a second semiconductor layer provided above the first conductive layers and in contact with the first semiconductor layer, and a first electrode provided in contact with an upper side of the second semiconductor layer; and a second chip including a second electrode in contact with the first electrode, and a second conductive layer in contact with the second electrode.

Hereinafter, at least one embodiment will be described with reference to drawings. In the following description, a common reference numeral is attached to components having the same functions and configurations. In the case of distinguishing components having a common reference numeral, subscripts are attached to the common reference numeral to distinguish the components from each other. When no particular distinguishingis needed for the plurality of components, only a common reference numeral is attached to the components, and no subscript is attached.

Each functional block may be implemented by any one of hardware and software or a combination of both. It is not necessary that functional blocks be distinguished from each other as described below. For example, some functions may be executed by functional blocks other than the exemplified functional blocks. Further, the exemplified functional block may be divided into finer functional sub-blocks. In the following description, the names of each functional block and each component are merely for convenience, and do not limit the configuration and the operation of each functional block and each component.

First Embodiment

Hereinafter, a semiconductor memory device 1 according to a first embodiment will be described.
[Configuration Example]
(1) Semiconductor Memory Device FIG. 1 is a block diagram illustrating an example of the configuration of the semiconductor memory device 1 according to the first embodiment. The semiconductor memory device 1 is, for example, a NAND-type flash memory capable of storing data in a non-volatile manner, and is controlled by an external memory controller 2. A combination of the semiconductor memory device 1 and the memory controller 2 may constitute a memory system 3 which is one semiconductor memory device. The memory system 3 is, for example, a memory card such as an SD™ card, a solid state drive (SSD) or the like.

Communication between the semiconductor memory device 1 and the memory controller 2 supports, for example, a NAND interface standard. In the communication between the semiconductor memory device 1 and the memory controller 2, for example, a command latch enable signal CLE, an address latch enable signal ALE, a write enable signal WEn, a read enable signal REn, a ready/busy signal RBn, and an input/output signal I/O are used.

The input/output signal I/O is, for example, a 8-bit signal, and can include a command CMD, address information ADD, data DAT and the like. In the following description, a reference numeral DAT is attached to both write data and read data. The semiconductor memory device 1 receives the command CMD, the address information ADD, and write data DAT from the memory controller 2 via the input/output signal I/O.

The command latch enable signal CLE is used to notify the semiconductor memory device 1 of a period during which the command CMD is transmitted via the signal I/O. The address latch enable signal ALE is used to notify the semiconductor memory device 1 of a period during which the address information ADD is transmitted via the signal I/O. The write enable signal WEn is used to enable the semiconductor memory device 1 to input the signal I/O. The read enable signal REn is used to enable the semiconductor memory device 1 to output the signal I/O. The ready/busy signal RBn is used to notify the memory controller 2 of whether the semiconductor memory device 1 is a ready state or a busy state. In the ready state, the semiconductor memory device 1 accepts a command from the memory controller 2. In the busy state, the semiconductor memory device 1 does not accept a command from the memory controller 2, except for exceptions.

The semiconductor memory device 1 includes a memory cell array 11 and a peripheral circuit PRC. The peripheral circuit PRC includes a row decoder 12, a sense amplifier 13, and a sequencer 14.

The memory cell array 11 includes blocks BLK0 to BLK(n−1) (n is an integer of 1 or more). The block BLK includes a plurality of non-volatile memory cells associated with bit lines and word lines, and is, for example, a data erasing unit.

The sequencer 14 controls the overall operation of the semiconductor memory device 1 on the basis of the received command CMD. For example, the sequencer 14 executes various operations such as a write operation and a read operation by controlling the row decoder 12, the sense amplifier 13, and the like. In the write operation, the received write data DAT is stored in the memory cell array 11. In the read operation, read data DAT is read from the memory cell array 11.

The row decoder 12 selects a certain block BLK as an execution target of various operations such as a read operation and a write operation on the basis of the received address information ADD. The row decoder 12 transmits a voltage to a word line according to the selected block BLK.

Figure 2:
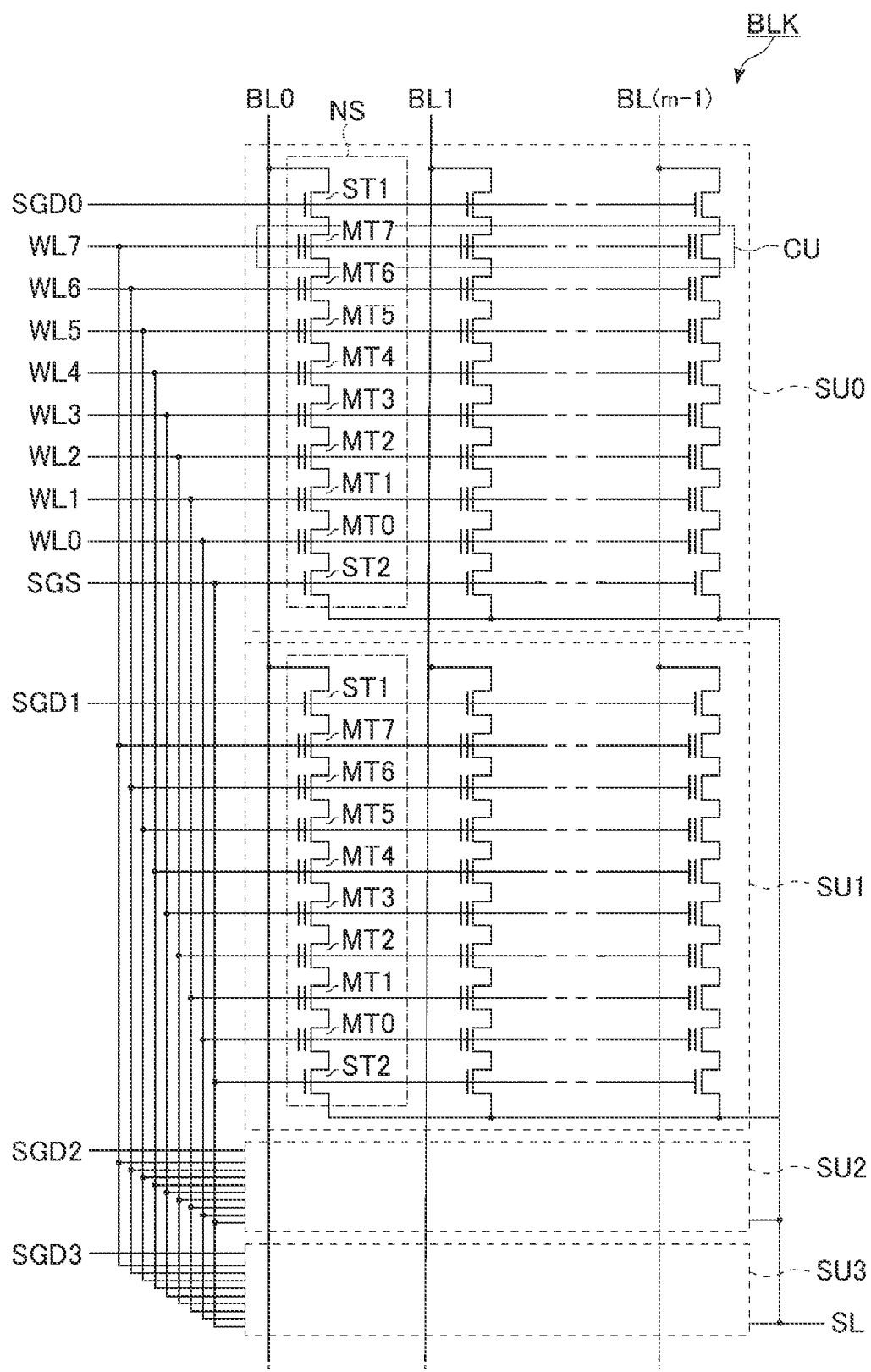
FIG. 2 is a view illustrating an example of a circuit configuration of a memory cell array of the semiconductor memory device according to the first embodiment.

The sense amplifier 13 executes a transmission operation of the data DAT between the memory controller 2 and the memory cell array 11 on the basis of the received address information ADD. That is, in the write operation, the sense amplifier 13 stores the received write data DAT, and applies a voltage to a bit line on the basis of the write data DAT. In the read operation, the sense amplifier 13 applies a voltage to a bit line, reads data stored in the memory cell array 11, as the read data DAT, and outputs the read data DAT to the memory controller 2.
(2) Memory Cell Array FIG. 2 illustrates an example of a circuit configuration of the memory cell array 11 of the semiconductor memory device 1 according to the first embodiment. As an example of the circuit configuration of the memory cell array 11, an example of a circuit configuration of a certain block BLK of the memory cell array 11 is illustrated. Each of other blocks BLK of the memory cell array 11 has, for example, the same circuit configuration as that illustrated in FIG. 2.

The block BLK includes, for example, four string units SU0 to SU3. Each string unit SU includes a plurality of NAND strings NS. The NAND strings NS are associated with m bit lines BL0 to BL(m−1) (m is an integer of 1 or more) on a one-to-one basis. Each NAND string NS is connected to the associated bit line BL, and includes, for example, memory cell transistors MT0 to MT7 and select transistors ST1 and ST2. Each memory cell transistor MT includes a control gate (hereinafter, also referred to as a gate) and a charge storage layer, and stores data in a non-volatile manner. Each of the select transistors ST1 and ST2 is used in selecting the NAND string NS including the select transistors ST1 and ST2 during various operations.

A drain of the select transistor ST1 of each NAND string NS is connected to the bit line BL associated with the NAND string NS. The memory cell transistors MT0 to MT7 are connected in series between a source of the select transistor ST1 and a drain of the select transistor ST2. A source of the select transistor ST2 is connected to a source line SL.

Wirings connected to respective gates of the select transistors ST1 and ST2, and the memory cell transistors MT0 to MT7 will be described by using an integer j and an integer k. The following descriptions are applicable to each case where j is an integer of 0 to 3 and each case where k is an integer of 0 to 7 in the example of FIG. 2.

Gates of the respective select transistors ST1 of the NAND strings NS provided in a string unit SUj are connected to a common select gate line SGDj. Gates of the respective select transistors ST2 of the NAND strings NS provided in the block BLK are connected to a common select gate line SGS. Gates of respective memory cell transistors MTk of the NAND strings NS provided in the block BLK are connected to a common word line WLk.

Each bit line BL is connected to the drain of the select transistor ST1 of the associated NAND string NS provided in each of the string units SU of the block BLK. The source line SL is commonly connected to the sources of the respective select transistors ST2 of the NAND strings NS provided in the block BLK and thus is shared among the string units SU of the block BLK. The source line SL is also connected in the same manner for, for example, different blocks BLK and thus is shared among the blocks BLK.

In one string unit SU, a set including memory cell transistors MT connected to one common word line WL is called, for example, a cell unit CU. For example, a set including respective equivalent 1-bit data pieces stored in the memory cell transistors MT in the cell unit CU is called, for example, "one page data." For example, when data having a plurality of bits is stored in each memory cell by an MLC method or the like, a plurality of pieces of such "one page data" can be stored in one cell unit CU.

The above description is made on the circuit configuration of the memory cell array 11, but the circuit configuration of the memory cell array 11 is not limited to those described above. For example, the number of string units SU provided in each block BLK can be designed as a freely selected number. The number of memory cell transistors MT and the numbers of the select transistors ST1 and ST2 provided in each NAND string NS can be designed as freely selected numbers. The number of word lines WL and the numbers of select gate lines SGD and SGS are changed on the basis of the number of memory cell transistors MT and the numbers of the select transistors ST1 and ST2 in the NAND string NS.

(3) Structure of Semiconductor Memory device

The structure of the semiconductor memory device 1 according to the first embodiment will be described with reference to drawings. The structure illustrated in the drawing referred to below is merely an example, and the structure of the semiconductor memory device 1 is not limited to the illustrated one. When it is explained that an object B is provided on the upper surface of an object A, with reference to the drawing illustrating that the object A and the object B are in contact with each other, for example, although the object A and the object B are in contact with each other, unless explicitly stated that there is no other object between the object A and the object B, another object interposed between the object A and the object B is not excluded. When it is explained that an object C contains a certain element or a compound, for example, it is intended that the object C is substantially composed of the element or the compound. The notation of "substantial" is used with intention that an error is tolerated in the design range.

Figure 3:
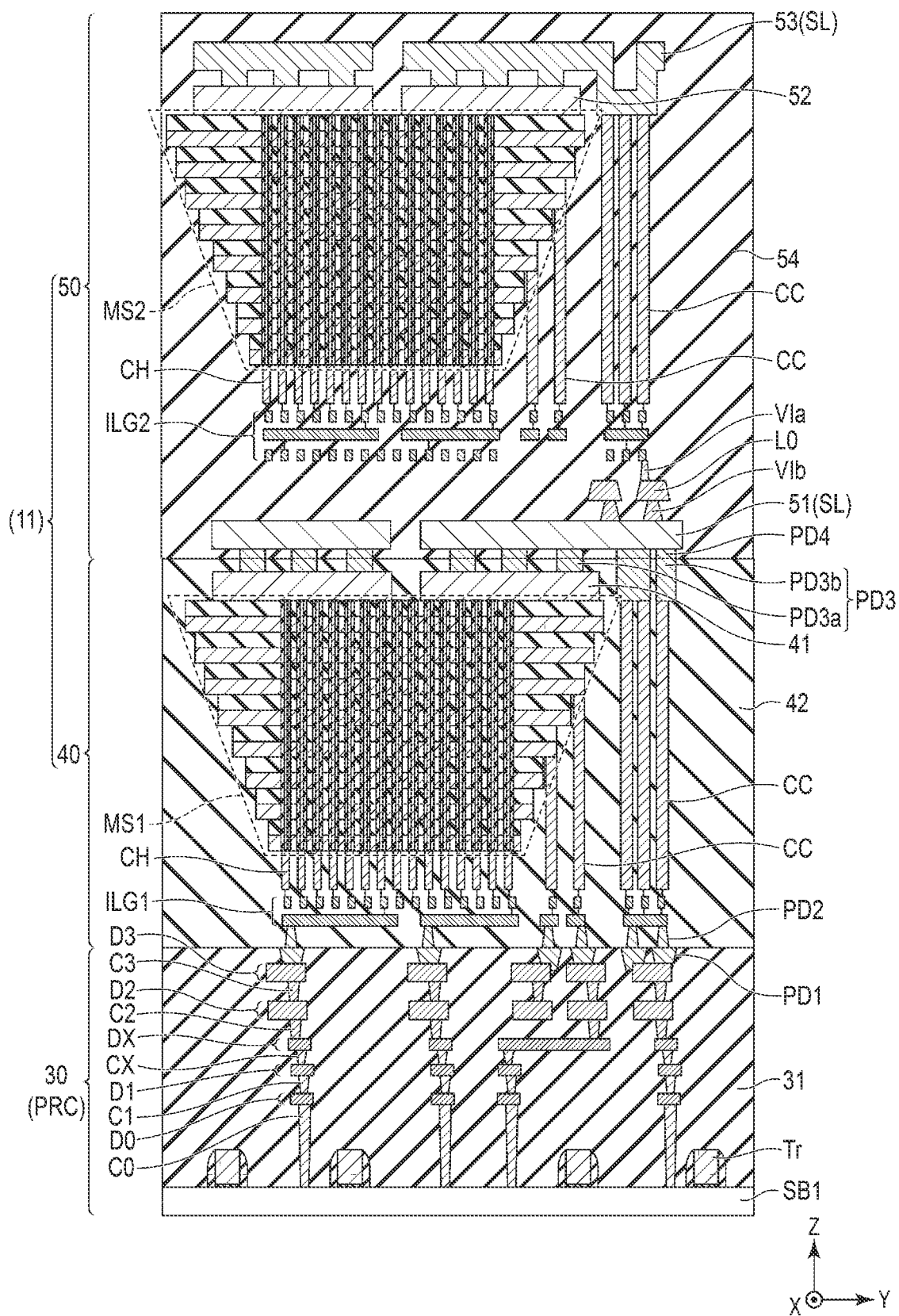
FIG. 3 is a sectional view illustrating an example of a cross-sectional structure of the semiconductor memory device according to the first embodiment.

FIG. 3 is a sectional view illustrating an example of a cross-sectional structure of the semiconductor memory device 1 according to the first embodiment.

The semiconductor memory device 1 has a structure where a peripheral circuit chip 30, a cell chip 40, and a cell chip 50 are bonded. In the peripheral circuit chip 30, the peripheral circuit PRC is provided. Each of the cell chip 40 and the cell chip 50 is provided with a part of the memory cell array 11.

Hereinafter, for the purpose of facilitating reference, directions are defined with reference to a semiconductor substrate SB1 provided in the peripheral circuit chip 30. For example, two mutually orthogonal directions parallel to one surface of the semiconductor substrate SB1 are defined as the X direction and the Y direction. A direction intersecting the surface, in which peripheral circuit elements are formed with respect to the surface, is defined as the Z direction. In the description, the Z direction is orthogonal to the X direction and the Y direction, but is not necessarily limited thereto. Hereinafter, descriptions will be made with the Z direction, as "up," and the direction opposite to the Z direction, as "down," but this notation is merely for convenience and is independent of, for example, the direction of gravity.

The peripheral circuit chip 30, the cell chip 40, and the cell chip 50 are sequentially disposed to be adjacent to each other in the order of the peripheral circuit chip 30, the cell chip 40, and the cell chip 50 along the Z direction.

First, the structure of the peripheral circuit chip 30 will be described.

The semiconductor substrate SB1 provided in the peripheral circuit chip 30 contains, for example, silicon (Si). On the upper surface of the semiconductor substrate SB1, a plurality of metal oxide semiconductor (MOS) transistors Tr are provided as peripheral circuit elements provided in the peripheral circuit PRC. Each transistor Tr includes a gate insulator on the upper surface of the semiconductor substrate SB1, a gate electrode on the upper surface of the gate insulator, and a pair of source/drain regions in the semiconductor substrate SB1 in which a region below the gate insulator is present between the source/drain regions.

Metal wiring layers D0, D1, DX, D2, and D3 are provided above the transistor Tr. Each metal wiring layer includes a plurality of wirings insulated from each other. Through these wirings, a source, a drain, and a gate of each transistor Tr can be electrically connected to other components, respectively. In FIG. 3, descriptions are made on a case where five metal wiring layers are provided, but the present disclosure is not necessarily limited thereto.

Specifically, for example, a contact plug C0 is provided on the upper surface of the source/drain region of a certain transistor Tr. The upper surface of the contact plug C0 is in contact with a certain wiring in the metal wiring layer D0. For example, a contact plug C1 is provided on the upper surface of the wiring. The upper surface of the contact plug C1 is in contact with a certain wiring in the metal wiring layer D1. For example, a contact plug CX is provided on the upper surface of the wiring. The upper surface of the contact plug CX is in contact with a certain wiring in the metal wiring layer DX. For example, a contact plug C2 is provided on the upper surface of the wiring. The upper surface of the contact plug C2 is in contact with a certain wiring in the metal wiring layer D2. For example, a contact plug C3 is provided on the upper surface of the wiring. The upper surface of the contact plug C3 is in contact with a certain wiring in the metal wiring layer D3. A conductor PD1 is provided on the upper surface of the wiring. The conductor PD1 contains, for example, a metal material such as copper (Cu). The upper surface of the conductor PD1 forms a part of the upper surface of the peripheral circuit chip 30, and is located substantially at the same position as the upper surface of the peripheral circuit chip 30 in the Z direction. The conductor PD1 functions as an electrode pad used for electrical connection with another chip. Hereinafter, conductors provided on the upper surface of the peripheral circuit chip 30 and functioning as electrode pads are collectively referred to as conductors PD1. In the following description, to conductors functioning as electrode pads in this manner, a reference numeral PD is attached. In the present specification, the contact plug C2 and the wiring in the metal wiring layer D2 are distinguished from each other, but the contact plug C2 and the wiring in the metal wiring layer D2, which are in contact with each other in the illustration, are, for example, integrated. The same also applies to the contact plug C3 and the wiring in the metal wiring layer D3. The combination of the contact plug and the wiring at another place may also be similarly integrated.

The above described connection through wirings in the metal wiring layers D0, D1, DX, D2, and D3 is merely an example. In the peripheral circuit chip 30, the various contact plugs, the wirings in the metal wiring layers D0, D1, DX, D2, and D3, and the conductor PD1, as described above, are also additionally provided. In FIG. 3, for ease of reference, not all of these various contact plugs, the wirings in the metal wiring layers D0, D1, DX, D2, and D3, and the conductor PD1 are necessarily illustrated.

Between the semiconductor substrate SB1 and the upper surface of the peripheral circuit chip 30, an insulator 31 is provided in a portion where the transistors Tr, the various contact plugs, the wirings in the metal wiring layers D0, D1, DX, D2, and D3, and the conductors PD1 are not provided. The insulator 31 contains, for example, silicon oxide ($SiO_2$).

Next, the structure of the cell chip 40 will be described. The cell chip 40 is provided on the upper surface of the peripheral circuit chip 30. The cell chip 40 includes a stacked body MS1 functioning as a part of the memory cell array 11. More specifically, each of memory pillars provided in the stacked body MS1 functions as, for example, one NAND string NS.

A plurality of conductors PD2 are provided on the lower surface of the cell chip 40. More specifically, this is as follows. For each of the conductors PD1 of the peripheral circuit chip 30, the conductor PD2 is provided to come in contact with the upper surface of the conductor PD1. Therefore, the lower surface of the conductor PD2 forms a part of the lower surface of the cell chip 40, and is located substantially at the same position as the lower surface of the cell chip 40 in the Z direction. The conductor PD2 contains, for example, a metal material such as copper (Cu). Hereinafter, conductors provided on the lower surface of the cell chip 40 and functioning as electrode pads are collectively referred to as conductors PD2.

The upper surface of a certain conductor PD2 is in contact with, for example, a certain wiring in the lowermost metal wiring layer of a metal wiring layer group ILG1. The wiring is electrically connected to, for example, a certain wiring in the uppermost metal wiring layer of the metal wiring layer group ILG1 via wirings in other metal wiring layers of the metal wiring layer group ILG1. The wiring is electrically connected to, for example, a certain contact plug CH above the metal wiring layer group ILG1. In this manner, the conductor PD2 is electrically connected to the contact plug CH. The upper surface of the contact plug CH is in contact with the lower end of a certain memory pillar of the stacked body MS1. Among the wirings in the metal wiring layer group ILG1, each wiring electrically connected to the contact plug CH in this manner functions as a part of the bit line BL.

Similarly to the conductor PD2 electrically connected to the contact plug CH, another conductor PD2 is electrically connected to a certain contact plug CC above the metal wiring layer group ILG1 via the wiring in each wiring layer of the metal wiring layer group ILG1. The upper surface of the contact plug CC is in contact with the lower surface of a certain conductive layer in the stacked body MS1. For the purpose of ease of reference, FIG. 3 illustrates only two such connection relationships from the conductor PD2 to the contact plug CC. Among the wirings in the metal wiring layer group ILG1, each wiring electrically connected to the contact plug CC in this manner functions as a part of any one of the word lines WL and the select gate lines SGD and SGS.

A conductor 41 is provided on the upper surface of the stacked body MS1. The conductor 41 is made of, for example, a semiconductor, and contains polysilicon (Si). The conductor 41 functions as a part of the source line SL. In the example of FIG. 3, two conductors 41 are provided at intervals. For example, plane division is made by the intervals.

A conductor PD3a is provided on the upper surface of the conductor 41. The conductor PD3a contains, for example, a metal material such as copper (Cu). The upper surface of the conductor PD3a forms a part of the upper surface of the cell chip 40, and is located substantially at the same position as the upper surface of the cell chip 40 in the Z direction. In the descriptions, the conductor PD3a is provided on the upper surface of the conductor 41, but the present embodiment is not limited thereto. For example, another conductor may be provided between the conductor 41 and the conductor PD3a. In this case, for example, a combination between the conductor PD3a and the separate conductor can be considered as functioning as an electrode pad. The same also applies to other conductors PD.

Further, another conductor PD2 is electrically connected to a separate contact plug CC above the metal wiring layer group ILG1 via the wiring in each wiring layer of the metal wiring layer group ILG1. The contact plug CC is located at a position not overlapping with the stacked body MS1 when viewed from above. The upper surface of the contact plug CC is located substantially at the same position as the upper surface of the stacked body MS1 in the Z direction. A conductor PD3b is provided on the upper surface of the contact plug CC. The conductor PD3b contains, for example, a metal material such as copper (Cu). The upper surface of the conductor PD3b forms a part of the upper surface of the cell chip 40, and is located substantially at the same position as the upper surface of the cell chip 40 in the Z direction.

Hereinafter, conductors such as the conductors PD3a and PD3b, which are provided on the upper surface of the cell chip 40 and functioning as electrode pads, are collectively referred to as conductors PD3. Each of the conductors PD3 contains, for example, a metal material such as copper (Cu) as described above.

Between the lower surface and the upper surface of the cell chip 40, an insulator 42 is provided in a portion where the conductors PD2, the wirings in the wiring layers of the metal wiring layer group ILG1, various contact plugs, the stacked body MS1, the conductors 41, and the conductors PD3 are not provided. The insulator 42 contains, for example, silicon oxide ($SiO_2$).

Next, the structure of the cell chip 50 will be described. The cell chip 50 is provided on the upper surface of the cell chip 40. The cell chip 50 includes a stacked body MS2 functioning as a part of the memory cell array 11 similarly to the stacked body MS1.

A plurality of conductors PD4 are provided on the lower surface of the cell chip 50. More specifically, this is as follows. For each of the conductors PD3 of the cell chip 40, the conductor PD4 is provided to come in contact with the upper surface of the conductor PD3. Therefore, the lower surface of the conductor PD4 forms a part of the lower surface of the cell chip 50, and is located substantially at the same position as the lower surface of the cell chip 50 in the Z direction. The conductor PD4 contains, for example, a metal material such as copper (Cu). Hereinafter, conductors provided on the lower surface of the cell chip 50 and functioning as electrode pads are collectively referred to as conductors PD4. Each of the conductors PD4 contains, for example, a metal material such as copper (Cu) as described above.

A conductor 51 is provided on the upper surfaces of the plurality of conductors PD4. The conductor 51 extends in, for example, a planar shape parallel to the X direction and the Y direction. The conductor 51 contains, for example, copper (Cu). The conductor 51 functions as a part of the source line SL. In descriptions of the present specification, the conductor 51 contains, for example, copper (Cu), but the conductor 51 may contain, for example, aluminum (Al).

A metal wiring layer group ILG2 is provided above the conductor 51.

A certain wiring in the metal wiring layer group ILG2 is electrically connected to, for example, a certain contact plug CH above the metal wiring layer group ILG2. The upper surface of the contact plug CH is in contact with the lower end of a certain memory pillar of the stacked body MS2. Among the wirings in the metal wiring layer group ILG2, each wiring electrically connected to the contact plug CH in this manner functions as a part of the bit line BL.

A certain wiring in the metal wiring layer group ILG2 is electrically connected to, for example, a certain contact plug CC above the metal wiring layer group ILG2. The upper surface of the contact plug CC is in contact with the lower surface of a certain conductive layer in the stacked body MS2. For the purpose of ease of reference, FIG. 3 illustrates only two such contact plugs CC. Among the wirings in the metal wiring layer group ILG2, each wiring electrically connected to the contact plug CC in this manner functions as a part of any one of the word lines WL and the select gate lines SGD and SGS.

The conductor 51 is electrically connected to, for example, a certain wiring in the lowermost metal wiring layer of the metal wiring layer group ILG2 via a certain contact plug VIb provided on the upper surface of the conductor 51, a certain wiring L0 provided on the upper surface of the contact plug VIb, and a certain contact plug VIa provided on the upper surface of the wiring L0. The wiring is electrically connected to, for example, a certain wiring in the uppermost metal wiring layer of the metal wiring layer group ILG2 via wirings in other metal wiring layers of the metal wiring layer group ILG2. The wiring is electrically connected to, for example, a separate contact plug CC above the metal wiring layer group ILG2. In this manner, the conductor 51 is electrically connected to the contact plug CC. The contact plug CC is located at a position not overlapping with the stacked body MS2 when viewed from above. The upper surface of the contact plug CC is located substantially at the same position as the upper surface of the stacked body MS2 in the Z direction.

A conductor 52 is provided on the upper surface of the stacked body MS2. The conductor 52 is made of, for example, a semiconductor, and contains polysilicon (Si). The conductor 52 functions as a part of the source line SL. In the example of FIG. 3, two conductors 52 are provided at intervals. For example, plane division is made by the intervals.

A conductor 53 is provided on the upper surface of the conductor 52, and on the upper surface of the contact plug CC electrically connected to the conductor 51. The conductor 53 extends in a planar shape parallel to the X direction and the Y direction, for example, in a region overlapping with the conductor 52 when viewed from above. The conductor 53 contains, for example, aluminum (Al). The conductor 53 functions as, for example, a part of the source line SL.

The upper surface of the cell chip 50 is located above the upper end of the conductor 53. Between the lower surface and the upper surface of the cell chip 50, an insulator 54 is provided in a portion where the conductors PD4, the conductors 51, the wirings L0, the wirings in the wiring layers of the metal wiring layer group ILG2, various contact plugs, the stacked body MS2, the conductors 52, and the conductors 53 are not provided. The insulator 54 contains, for example, silicon oxide ($SiO_2$).

In the above described structure, a planar metal wiring functioning as a part of the source line SL is not present in the cell chip 40, but is present in the cell chip 50. Specifically, the conductor 51 and the conductor 53 are present in the cell chip 50.

In the above described structure, the peripheral circuit chip 30, the cell chip 40, and the cell chip 50 are connected via the electrode pads, and thus each wiring functioning as a part of the source line SL is electrically connected to the transistor Tr in the peripheral circuit chip 30. Further, the wiring functioning as a part of the bit line BL, the word line WL, and the select gate lines SGD and SGS is also electrically connected to the transistor Tr of the peripheral circuit chip 30.

Figure 4:
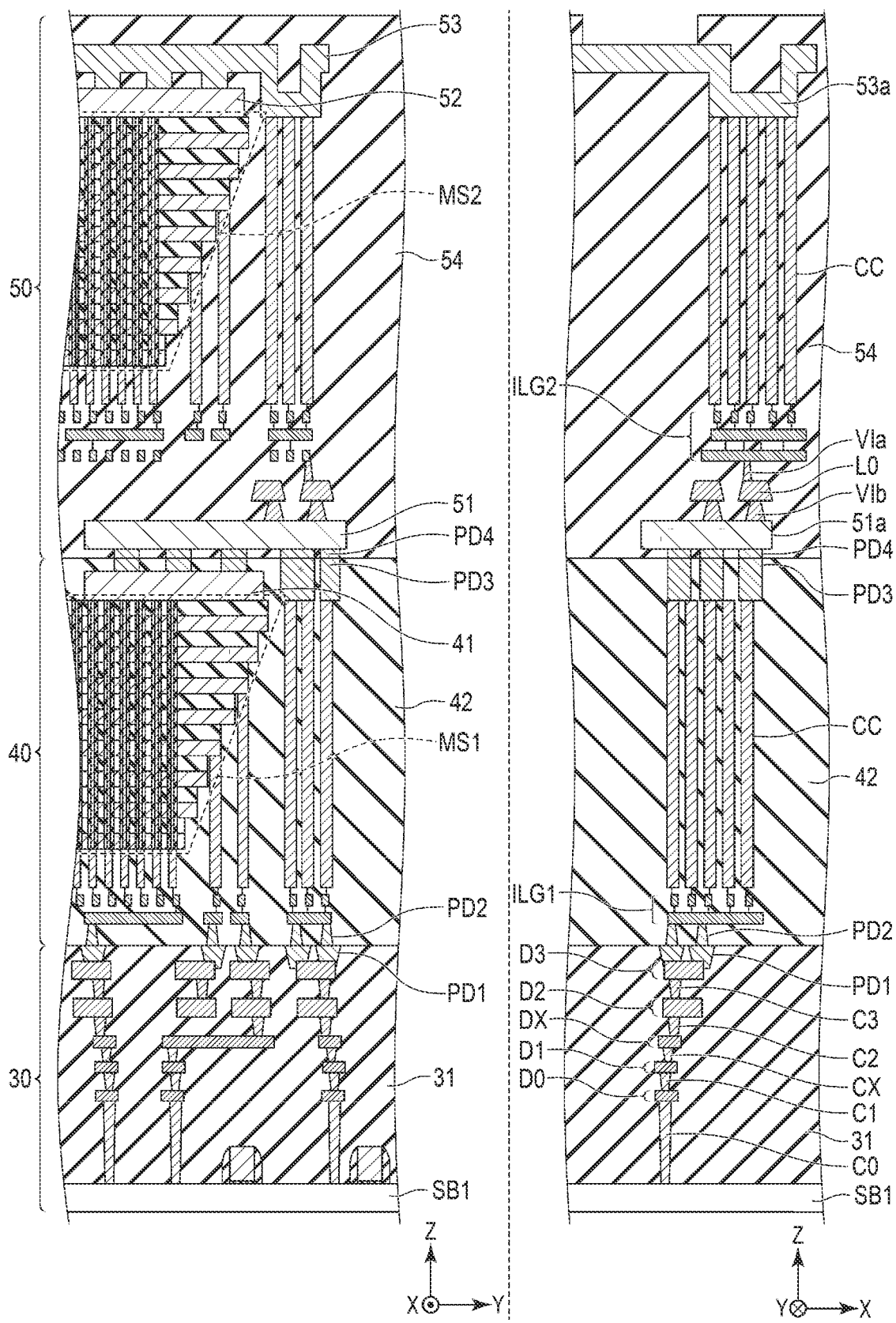
FIG. 4 is a sectional view illustrating an example of another cross-sectional structure of the semiconductor memory device according to the first embodiment.

FIG. 4 is a sectional view illustrating an example of another cross-sectional structure of the semiconductor memory device 1 according to the first embodiment. In FIG. 4, a part of the sectional view illustrated in FIG. 3 is also illustrated in a parallel manner for ease of reference.

Explanations will be made focusing on a certain contact plug CC provided on the cell chip 40. The upper surface of the contact plug CC is located substantially at the same position as the upper surface of the stacked body MS1 in the Z direction. A certain conductor PD3 is provided on the upper surface of the contact plug CC.

Next, among configurations provided in the cell chip 50, those electrically connected to the contact plug CC will be described.

A certain conductor PD4 is provided on the lower surface of the cell chip 50 so as to come in contact with the upper surface of the conductor PD3. A conductor 51a is provided on the upper surface of the conductor PD4. The conductor 51a is provided in the same metal wiring layer as the conductor 51, and contains, for example, copper (Cu) like the conductor 51. The conductor 51a is electrically connected to a certain contact plug CC above the metal wiring layer group ILG2 via a certain contact plug VIb provided on the upper surface of the conductor 51a, a certain wiring L0 provided on the upper surface of the contact plug VIb, a certain contact plug Via provided on the upper surface of the wiring L0, and the wiring in each wiring layer of the metal wiring layer group ILG2. The upper surface of the contact plug CC is located substantially at the same position as the upper surface of the stacked body MS2 in the Z direction.

A conductor 53a is provided on the upper surface of the contact plug CC. The conductor 53a contains, for example, aluminum (Al) like the conductor 53.

The upper surface of the cell chip 50 is located above the upper end of the conductor 53a, but a portion of the conductor 53a is exposed on the upper surface of the cell chip 50. The portion functions as, for example, a pad (i.e., an IO pad) for transmitting input/output signals of the semiconductor memory device 1, or a pad (i.e., a power supply pad) for supplying a power supply voltage to the semiconductor memory device 1.

In the above described structure, the peripheral circuit chip 30, the cell chip 40, and the cell chip 50 are connected via the electrode pads, and thus each of the IO pad and the power supply pad is electrically connected to the transistor Tr in the peripheral circuit chip 30.

Figure 5:
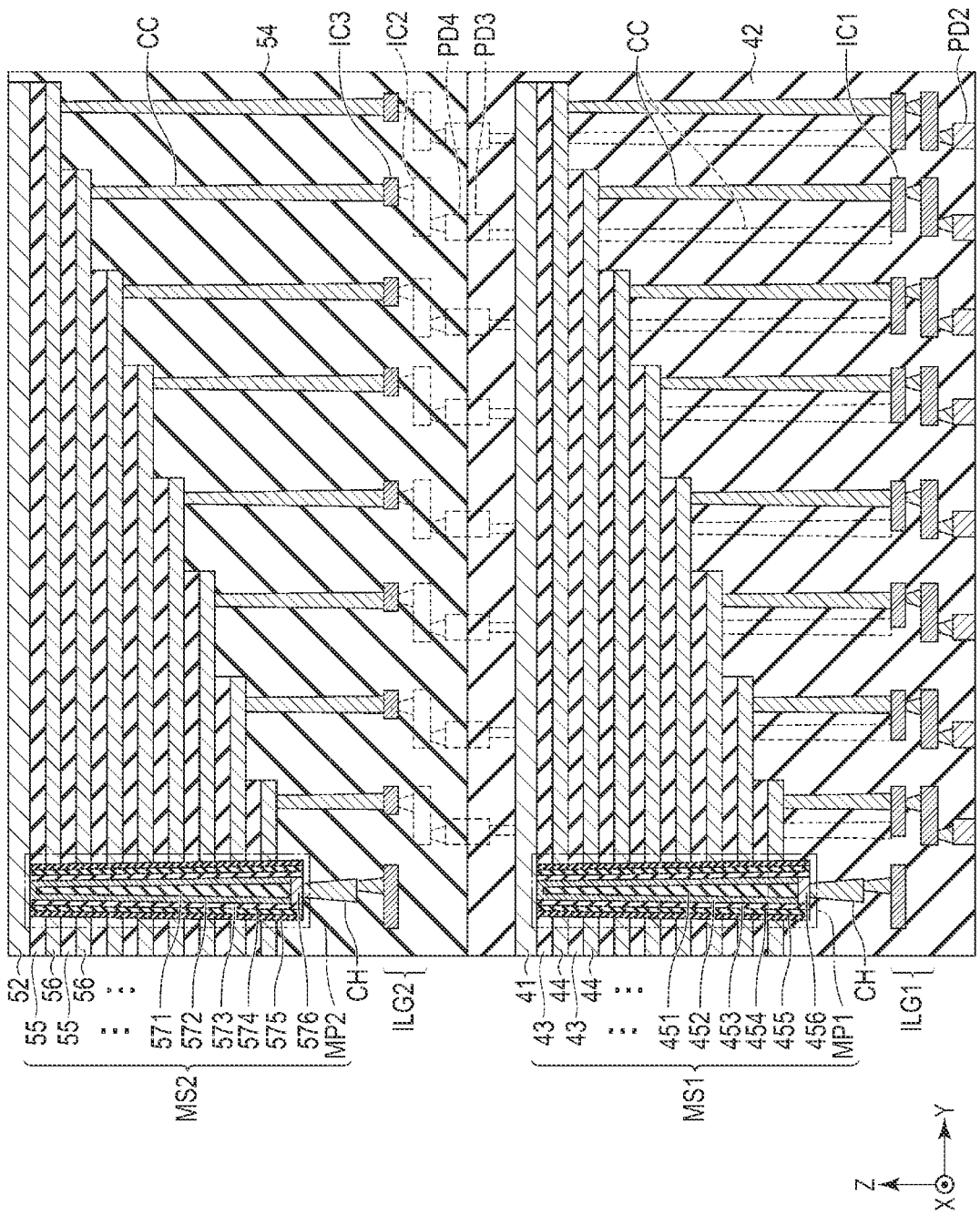
FIG. 5 is a sectional view illustrating details of the structures of two stacked bodies of the semiconductor memory device according to the first embodiment.

FIG. 5 is a sectional view illustrating details of the structures of the stacked bodies MS1 and MS2 of the semiconductor memory device 1 according to the first embodiment. FIG. 5 illustrates a sectional view of one cross section parallel to the cross section illustrated in FIG. 3.

First, the structure of the stacked body MS1 will be described.

The stacked body MS1 includes a structure in which an insulator 43 and a conductor 44 are alternately stacked, and a memory pillar MP1 in the structure. The insulator 43 contains, for example, silicon oxide ($SiO_2$). The conductor 44 contains, for example, tungsten (W).

In the example of FIG. 5, in order from top, stacking of the insulator 43 and the conductor 44 in this order is repeated eight times. The conductor 41 illustrated in FIG. 3 is provided on the upper surface of the uppermost insulator 43. Each of the conductors 44 functions as a part of any one of the word lines WL, and the select gate lines SGD and SGS. For each conductor 44, the conductor 44 and one insulator 43 on the upper surface of the conductor 44 constitute one set. With each set as one step, the conductors 44 and the insulators 43 have a stepped shape. When viewed from below, the stepped shape has a region where the lower surface of the conductor 44 of each set does not overlap with a set below the set. The contact plug CC described with reference to FIG. 3 is in contact with the region.

The memory pillar MP1 is provided in the stacking of the insulators 43 and the conductors 44. The memory pillar MP1 extends in, for example, the Z direction. The upper end of the memory pillar MP1 reaches the conductor 41, and the lower end of the memory pillar MP1 is located below the lowermost conductor 44.

The memory pillar MP1 includes, for example, a core portion 451, a semiconductor 452, a tunnel oxide film 453, an insulating film 454, a block insulating film 455, and a semiconductor 456. Specifically, this is as follows. The upper end of the pillar-shaped core portion 451 is located above the upper surface of the uppermost conductor 44, and the lower end of the core portion 451 is located below the lower surface of the lowermost conductor 44. The side surface and the upper surface of the core portion 451 are covered with the semiconductor 452. The upper end of the semiconductor 452 is in contact with the conductor 41. For example, the semiconductor 456 is provided to come in contact with the lower ends of the core portion 451 and the semiconductor 452. For example, the tunnel oxide film 453, the insulating film 454, and the block insulating film 455 are sequentially provided on the side surfaces of the semiconductor 452 and the semiconductor 456 in the order of the tunnel oxide film 453, the insulating film 454, and the block insulating film 455. The semiconductors 452 and 456 contain, for example, silicon (Si). Each of the core portion 451, the tunnel oxide film 453, and the block insulating film 455 contains, for example, silicon oxide ($SiO_2$). The insulating film 454 contains, for example, silicon nitride (SiN), and functions as a charge storage film.

In the memory pillar MP1, each portion intersecting with each conductor 44 functions as either the memory cell transistor MT or the select transistor ST.

The contact plug CH illustrated in FIG. 3 is in contact with the lower end of the memory pillar MP1.

Next, the structure of the stacked body MS2 will be described.

Regarding the stacked body MS2, the same explanation as the explanation on the above described stacked body MS1 is applied. More specifically, in the explanation on the above described stacked body MS1, an explanation in which the conductor 41 is replaced with the conductor 52, the insulator 43 is replaced with an insulator 55, the conductor 44 is replaced with a conductor 56, and the memory pillar MP1 is replaced with a memory pillar MP2 is applied. In replacement of the memory pillar MP1 with the memory pillar MP2, the core portion 451 is replaced with a core portion 571, the semiconductor 452 is replaced with a semiconductor 572, the tunnel oxide film 453 is replaced with a tunnel oxide film 573, the insulating film 454 is replaced with an insulating film 574, the block insulating film 455 is replaced with a block insulating film 575, and the semiconductor 456 is replaced with a semiconductor 576.

Next, descriptions will be made focusing on a certain contact plug CC in contact with a certain conductor 44 of the stacked body MS1.

The contact plug CC is connected to, for example, a certain wiring IC1 in the metal wiring layer group ILG1. The wiring IC1 extends in, for example, the X direction. In a direction opposite to the X direction from the cross section illustrated in FIG. 5, the wiring IC1 is connected to, for example, another contact plug CC (indicated by the broken line in FIG. 5) above the metal wiring layer group ILG1. A certain conductor PD3 is provided on the upper surface of the contact plug CC.

A certain conductor PD4 is provided to come in contact with the upper surface of the conductor PD3. The upper surface of the conductor PD4 is connected to, for example, a certain wiring IC2 in a certain metal wiring layer of the metal wiring layer group ILG2. In a direction opposite to the X direction from the cross section illustrated in FIG. 5, the wiring IC2 is electrically connected to, for example, a certain wiring IC3 extending in, for example, the X direction in another metal wiring layer of the metal wiring layer group ILG2. The wiring IC3 is connected to, for example, a certain contact plug CC above the metal wiring layer group ILG2. As described above, the contact plug CC is in contact with a certain conductor 56 of the stacked body MS2.

In this manner, a certain conductor 44 of the stacked body MS1 is electrically connected to a certain conductor 56 of the stacked body MS2. The conductor 44 and the conductor 56 function as a part of, for example, the same word line WL.

The above description is made focusing on the contact plug CC in contact with one conductor 44 of the stacked body MS1, but the same also applies to each contact plug CC in contact with another conductor 44.

[Manufacturing Method]

FIG. 6 to FIG. 22 are sectional views sequentially illustrating steps of manufacturing the semiconductor memory device 1 according to the first embodiment.

Figure 6:
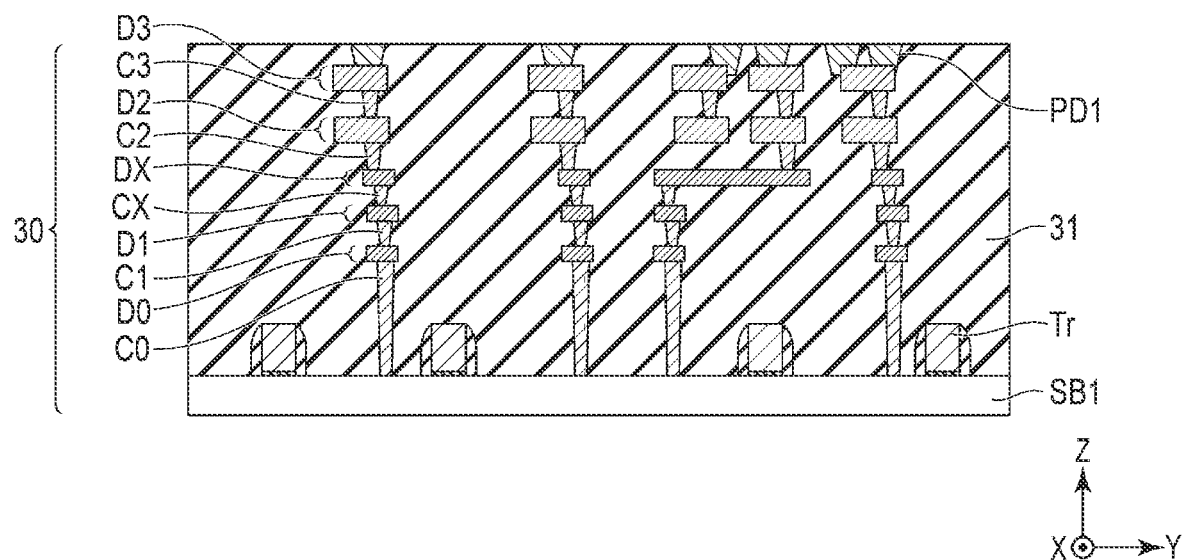
FIG. 6 is a sectional view illustrating an example of a certain step of manufacturing the semiconductor memory device according to the first embodiment.

First, the peripheral circuit chip 30 illustrated in FIG. 6 is manufactured.

Figure 7:
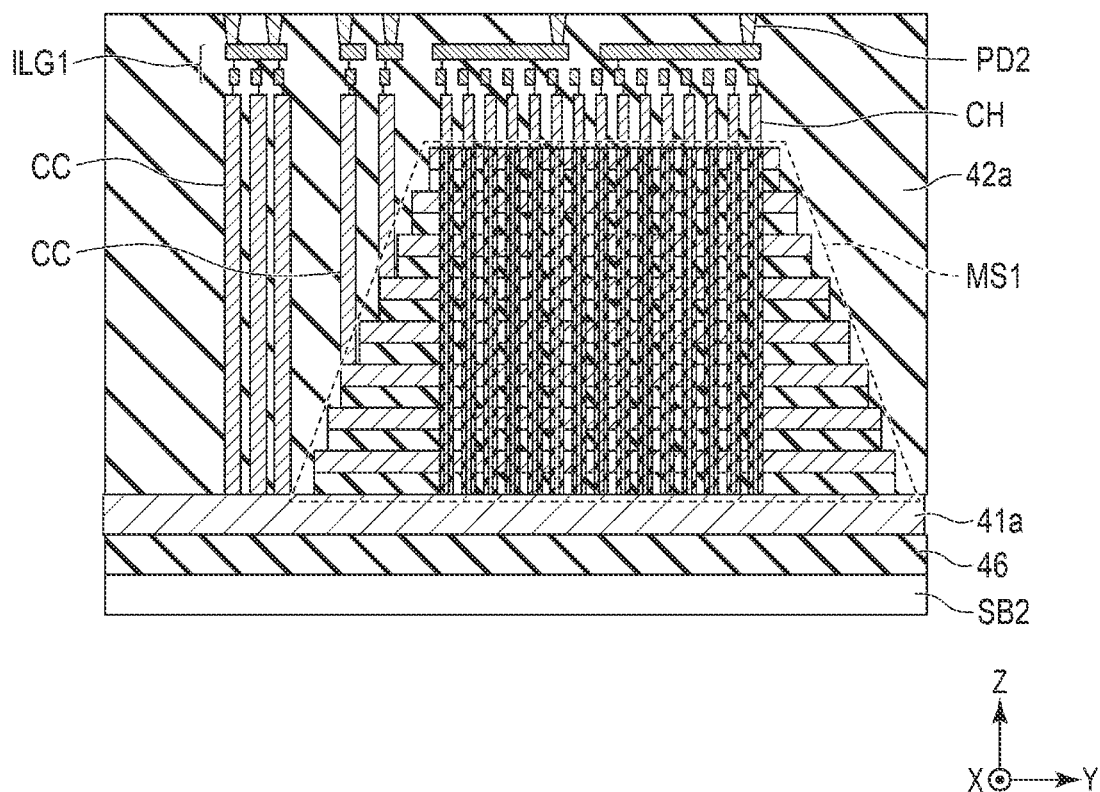
FIG. 7 is a sectional view illustrating an example of a certain step of manufacturing the semiconductor memory device according to the first embodiment.

Subsequently, the structure illustrated in FIG. 7 is manufactured. Specifically, this is as follows.

An insulator 46 is formed on the upper surface of a semiconductor substrate SB2. The semiconductor substrate SB2 contains, for example, silicon (Si). The insulator 46 contains, for example, silicon oxide ($SiO_2$). A conductor 41a is formed on the upper surface of the insulator 46. The conductor 41a is made of, for example, a semiconductor, and contains polysilicon (Si).

A structure corresponding to the stacked body MS1 illustrated in FIG. 5 is formed on the upper surface of the conductor 41a. More specifically, this is as follows.

The insulator 43 and a replacement member are alternately staked on the upper surface of the conductor 41a. The replacement member contains, for example, silicon nitride (SiN). Next, for example, through a lithography process and etching, a stepped shape is formed in the structure where the insulator 43 and the replacement member are alternately stacked. In the stepped shape, the upper surface of each replacement member has a region which does not overlap with a replacement member and the insulator 43, which are located above the replacement member. Subsequently, an insulator 42a is formed up to a position above the uppermost replacement member. The insulator 42a contains, for example, silicon oxide ($SiO_2$).

Subsequently, the memory pillar MP1 is formed in the structure where the insulator 43 and the replacement member are alternately stacked. Then, the replacement members are selectively removed by wet etching through a slit, and the conductors 44 are formed in spaces from which the replacement members are removed.

The structure where the insulator 43 and the conductor 44 are alternately stacked, and the memory pillar MP1, which are formed in this manner, correspond to the stacked body MS1 illustrated in FIG. 5.

In the structure manufactured through the above steps, the contact plug CH is formed on the upper surface of each memory pillar MP1, and the contact plug CC is formed on a region in the upper surface of each conductor 44 which does not overlap with the conductor 44 and the insulator 43 above the conductor 44. Further, the contact plug CC is also formed on the conductor 41a.

Subsequently, the metal wiring layer group ILG1 is formed above various contact plugs. For example, the insulator 42a is formed up to a position above the metal wiring layer group ILG1, and through anisotropic etching such as a reactive ion etching (RIE) method and damascene processing, for example, the plurality of conductors PD2 are formed on the upper surfaces of the wirings in the uppermost metal wiring layer of the metal wiring layer group ILG1. The upper surfaces of the conductors PD2 are flattened by, for example, chemical mechanical polishing (CMP) so as to be located substantially at the same position as the upper surface of the insulator 42a in the Z direction. Each conductor PD2 is electrically connected to any one of various contact plugs formed as described above, via the wiring in each wiring layer of the metal wiring layer group ILG1.

Figure 8:
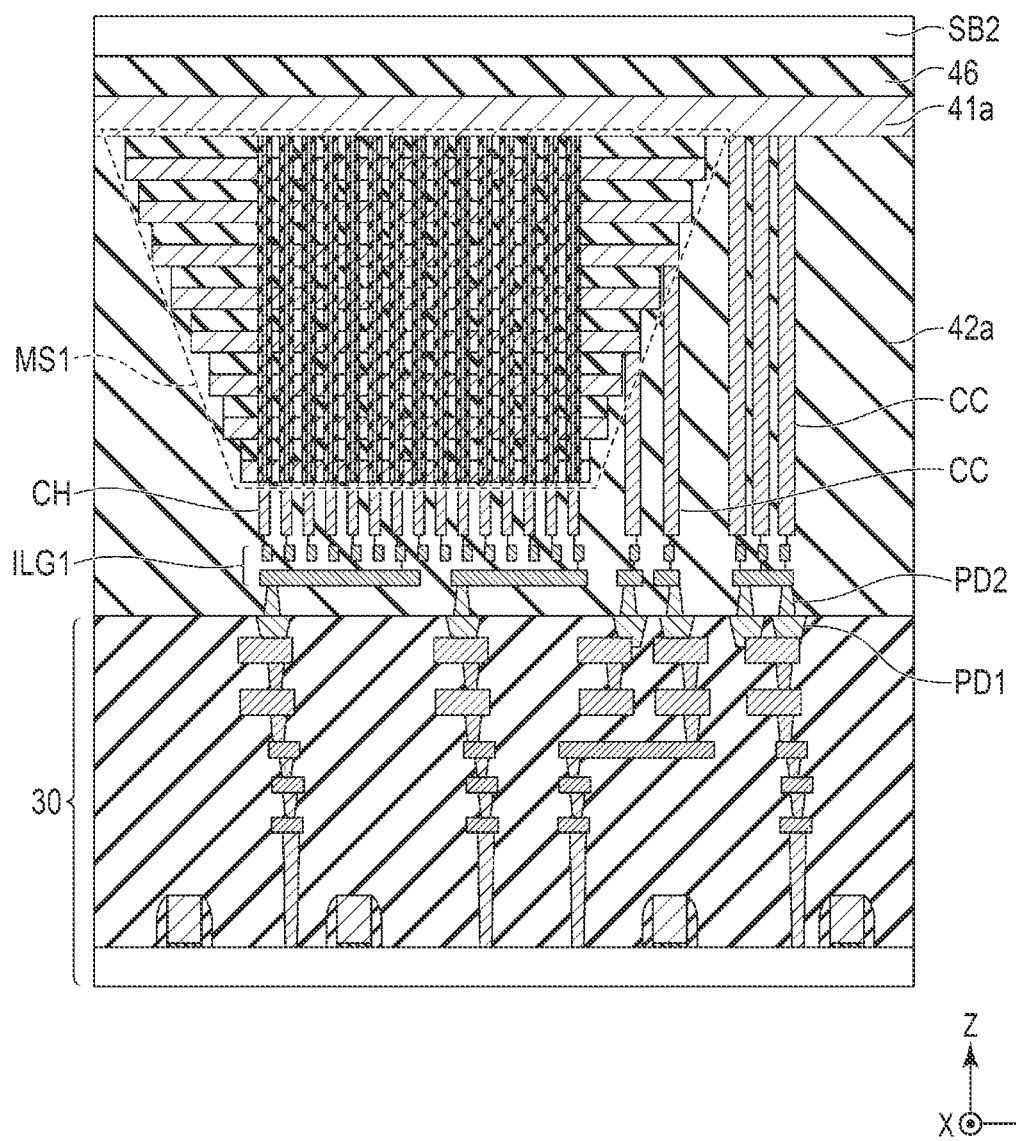
FIG. 8 is a sectional view illustrating an example of a certain step of manufacturing the semiconductor memory device according to the first embodiment.

Next, the upper surface of the structure manufactured in this manner is bonded to the upper surface of the peripheral circuit chip 30 illustrated in FIG. 6 as illustrated in FIG. 8. In the bonding, for each of the conductors PD1 of the peripheral circuit chip 30, any one of the conductors PD2 is brought into contact with the upper surface of the conductor PD1. Through the bonding, for example, the structure manufactured by the steps described with reference to FIG. 7 is turned upside down.

Figure 9:
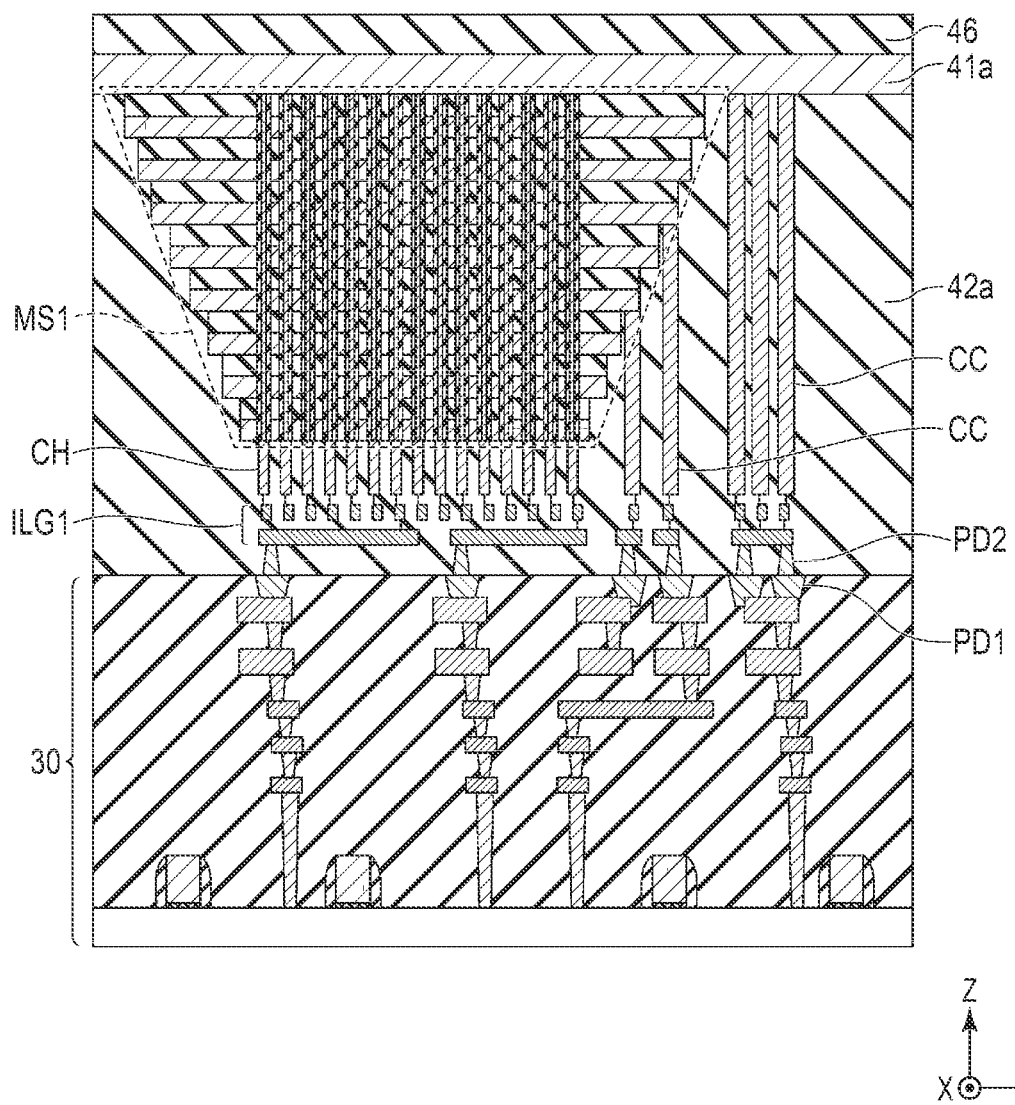
FIG. 9 is a sectional view illustrating an example of a certain step of manufacturing the semiconductor memory device according to the first embodiment.

Next, as illustrated in FIG. 9, the semiconductor substrate SB2 is removed by, for example, CMP.

Figure 10:
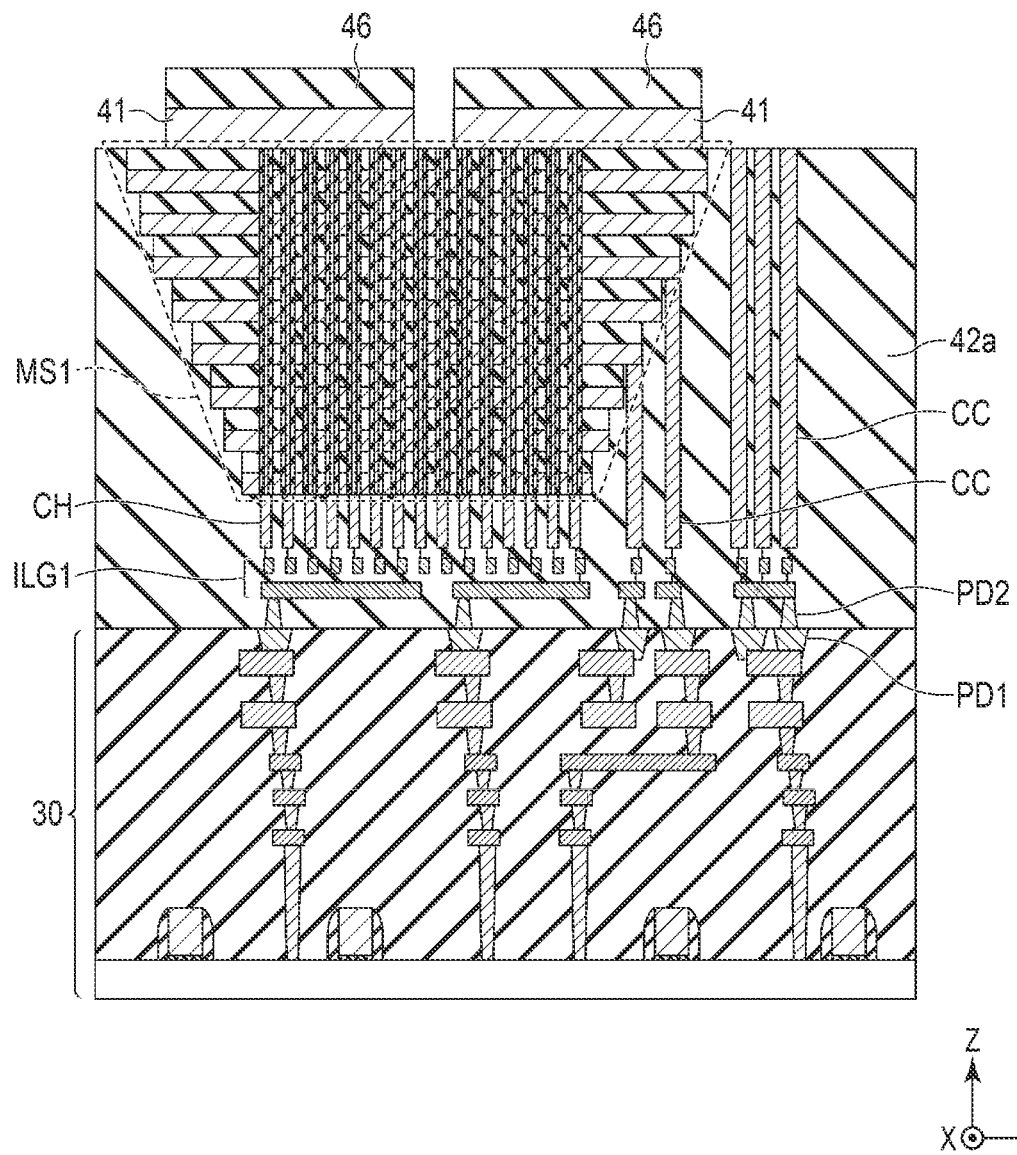
FIG. 10 is a sectional view illustrating an example of a certain step of manufacturing the semiconductor memory device according to the first embodiment.

Subsequently, as illustrated in FIG. 10, for example, an opening is formed in the insulator 46 by a lithography process, and the insulator 46 in which the opening is formed is used as a mask to perform anisotropic etching such as an RIE method so that the conductor 41a is divided for plane division. Further, a portion in the conductor 41a which is in contact with, for example, the contact plugs CC is removed. The conductor 41a after the division and the removal corresponds to the conductor 41 illustrated in FIG. 3. Each memory pillar MP1 that was in contact with a portion in the conductor 41a removed through plane division corresponds to a dummy pillar that does not include a portion used as the memory cell transistor MT. The division of the conductor 41a may be performed following the formation of the conductor 41a described with reference to FIG. 7.

Figure 11:
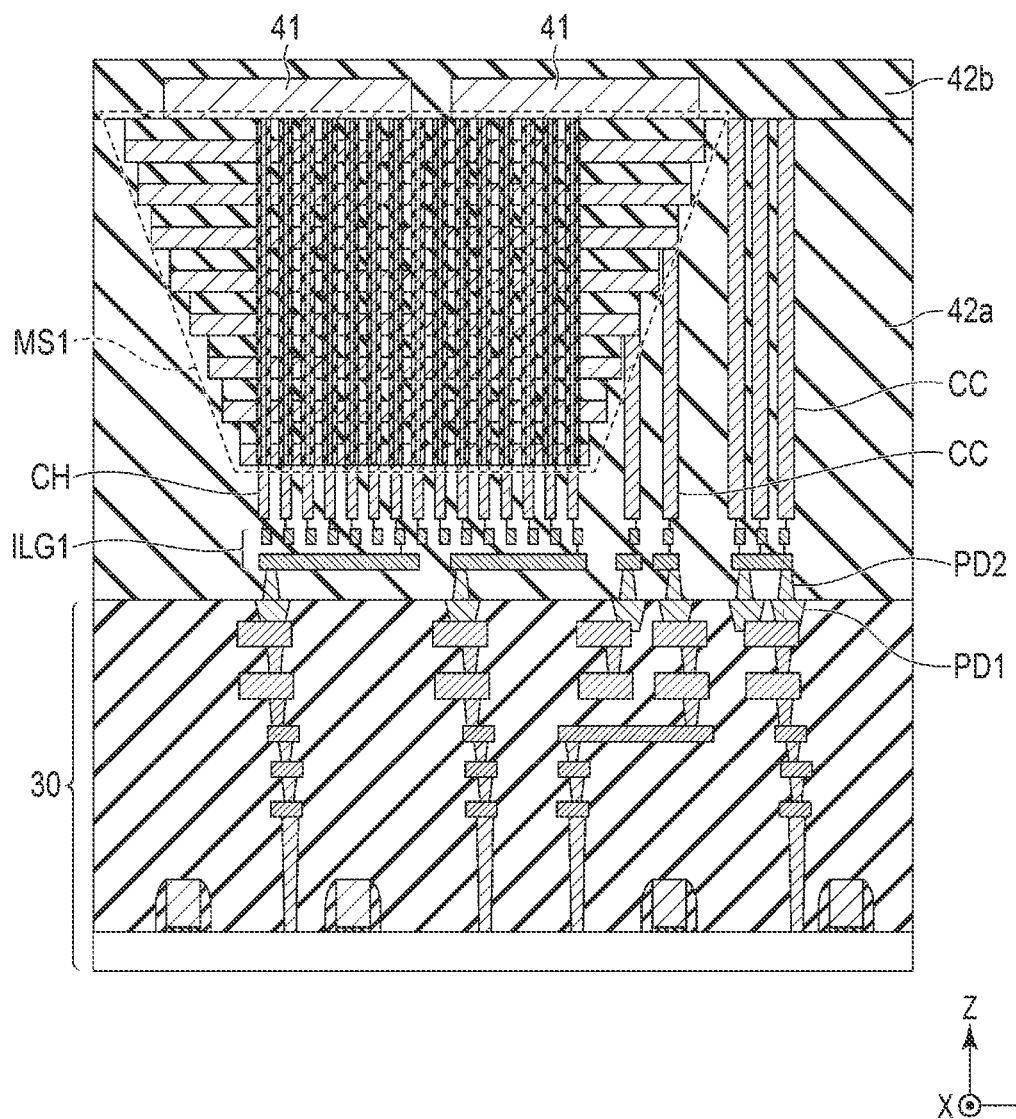
FIG. 11 is a sectional view illustrating an example of a certain step of manufacturing the semiconductor memory device according to the first embodiment.

Subsequently, as illustrated in FIG. 11, for example, an insulator is formed on the entire surface on the structure manufactured in the previous steps, and the structure after the formation of the insulator is flattened by CMP until the upper surfaces of the conductors 41 are exposed. Then, the insulator is formed up to a position above the conductor 41. In FIG. 11, the insulator formed in this manner is illustrated as an insulator 42b. The insulator 42b contains, for example, silicon oxide ($SiO_2$).

Figure 12:
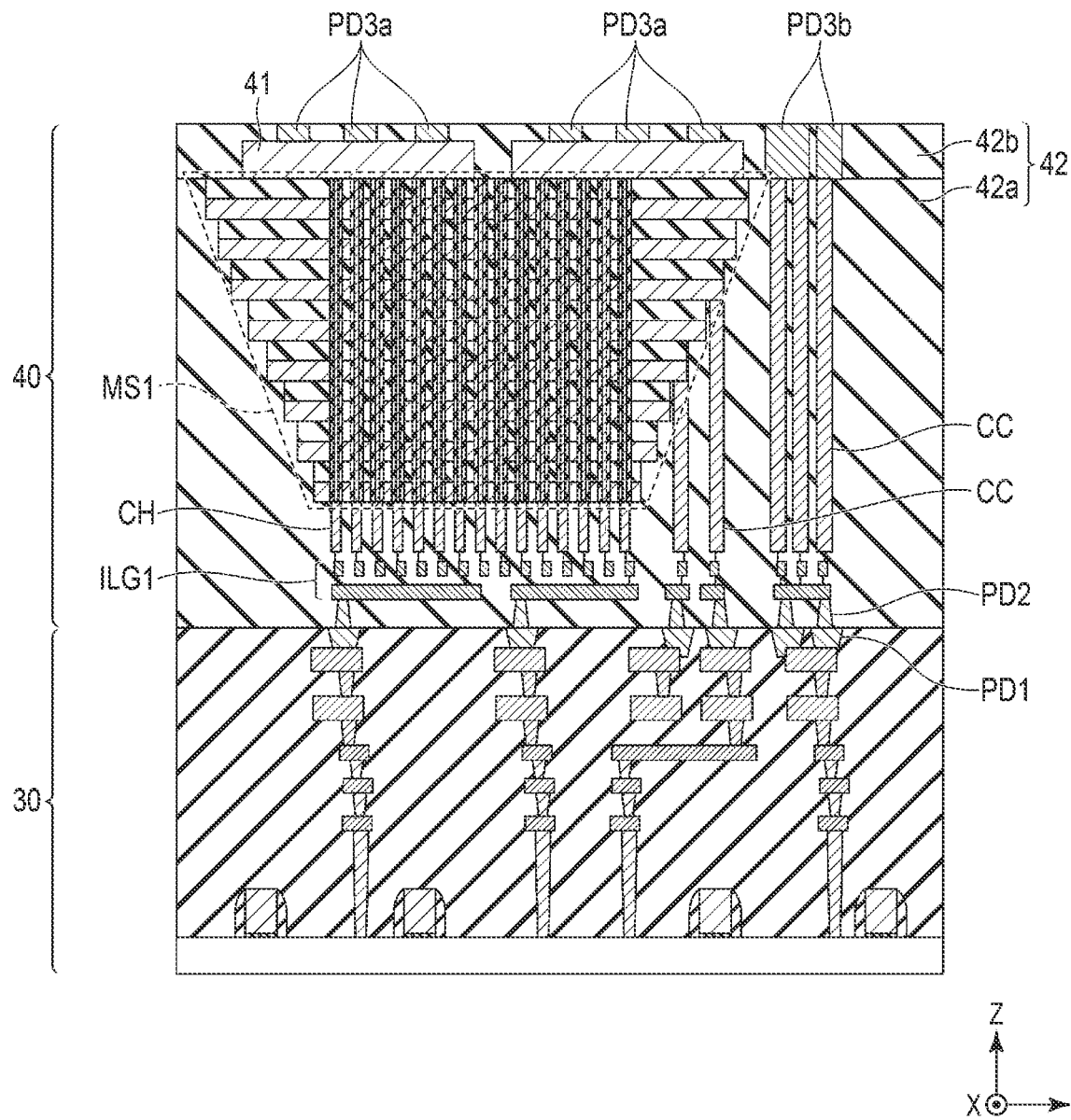
FIG. 12 is a sectional view illustrating an example of a certain step of manufacturing the semiconductor memory device according to the first embodiment.

Subsequently, as illustrated in FIG. 12, through anisotropic etching such as an RIE method and damascene processing, the conductors PD3a are formed on the upper surfaces of the conductors 41. The conductors PD3b are formed on the upper surfaces of the contact plugs CC which were in contact with the insulator 42b. The upper surfaces of the conductors PD3a and PD3b are flattened by, for example, CMP so as to be located substantially at the same position as the upper surface of the insulator 42b in the Z direction. In this manner, the conductors PD3 illustrated in FIGS. 3 to 5 are formed. The combination of the insulator 42a and the insulator 42b at this point in time corresponds to the insulator 42 illustrated in FIG. 3. Further, the structure manufactured on the peripheral circuit chip 30 in this manner corresponds to the cell chip 40 illustrated in FIG. 3.

Figure 13:
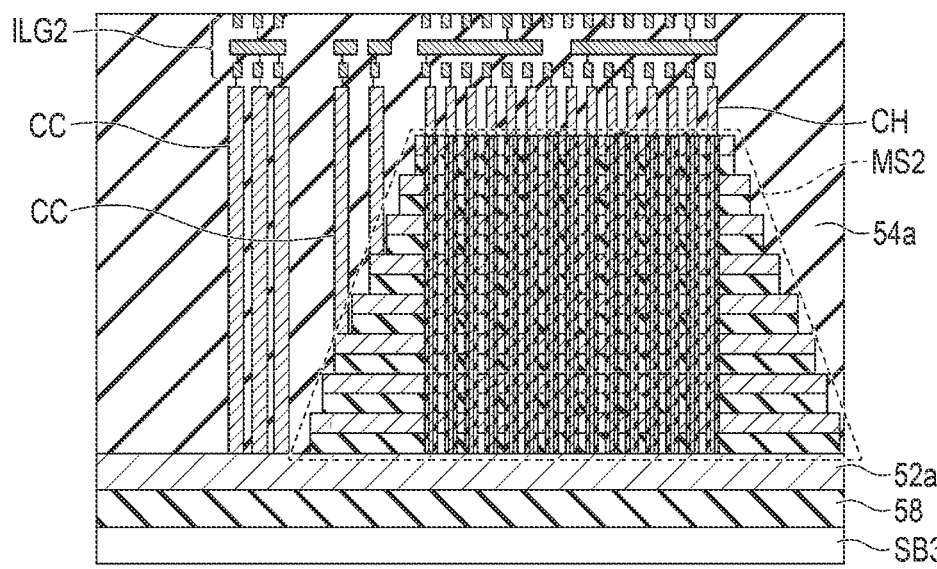
FIG. 13 is a sectional view illustrating an example of a certain step of manufacturing the semiconductor memory device according to the first embodiment.
Figure 13:
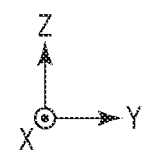

Next, the structure illustrated in FIG. 13 is manufactured.

Regarding the manufacturing of the structure, the same explanation as the explanation up to the formation of the metal wiring layer group ILG1 which was made with reference to FIG. 7 is applied. More specifically, in the explanation according to FIG. 7, an explanation in which the semiconductor substrate SB2 is replaced with a semiconductor substrate SB3, the insulator 46 is replaced with an insulator 58, the conductor 41a is replaced with a conductor 52a, the stacked body MS1 is replaced with the stacked body MS2, the memory pillar MP1 is replaced with the memory pillar MP2, the insulator 43 is replaced with the insulator 55, the conductor 44 is replaced with the conductor 56, the metal wiring layer group ILG1 is replaced with the metal wiring layer group ILG2, and the insulator 42a is replaced with an insulator 54a is applied. In the structure manufactured in this manner, for example, the insulator 54a is formed up to substantially the same position as the upper surfaces of the wirings in the uppermost metal wiring layer of the metal wiring layer group ILG2.

Figure 14:
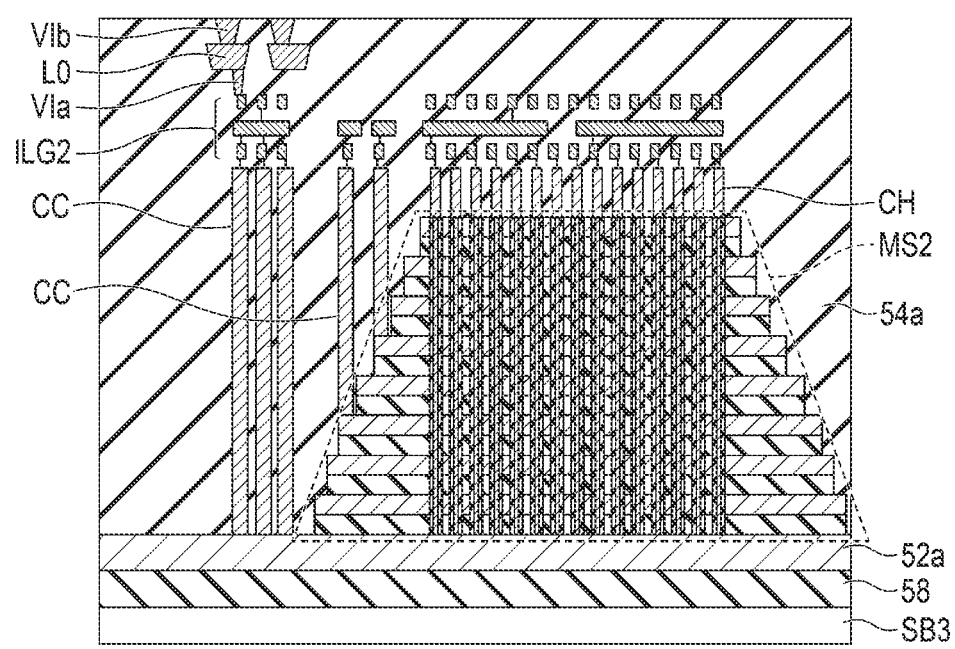
FIG. 14 is a sectional view illustrating an example of a certain step of manufacturing the semiconductor memory device according to the first embodiment.
Figure 14:
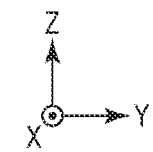

Subsequently, the structure illustrated in FIG. 14 is manufactured. Specifically, this is as follows.

A certain contact plug VIa is formed on the upper surface of a certain wiring in the uppermost metal wiring layer of the metal wiring layer group ILG2, a certain wiring L0 is formed on the upper surface of the contact plug VIa, and a certain contact plug VIb is formed on the upper surface of the wiring L0. In this manner, various contact plugs and the wirings L0 are formed. In the structure manufactured in this manner, for example, the insulator 54a is formed up to substantially the same position as the upper surfaces of the contact plugs VIb. The contact plug VIb, the wiring L0, and the contact plug VIa are electrically connected to the contact plug CC formed on the conductor 52a via the wiring in each wiring layer of the metal wiring layer group ILG2.

Figure 15:
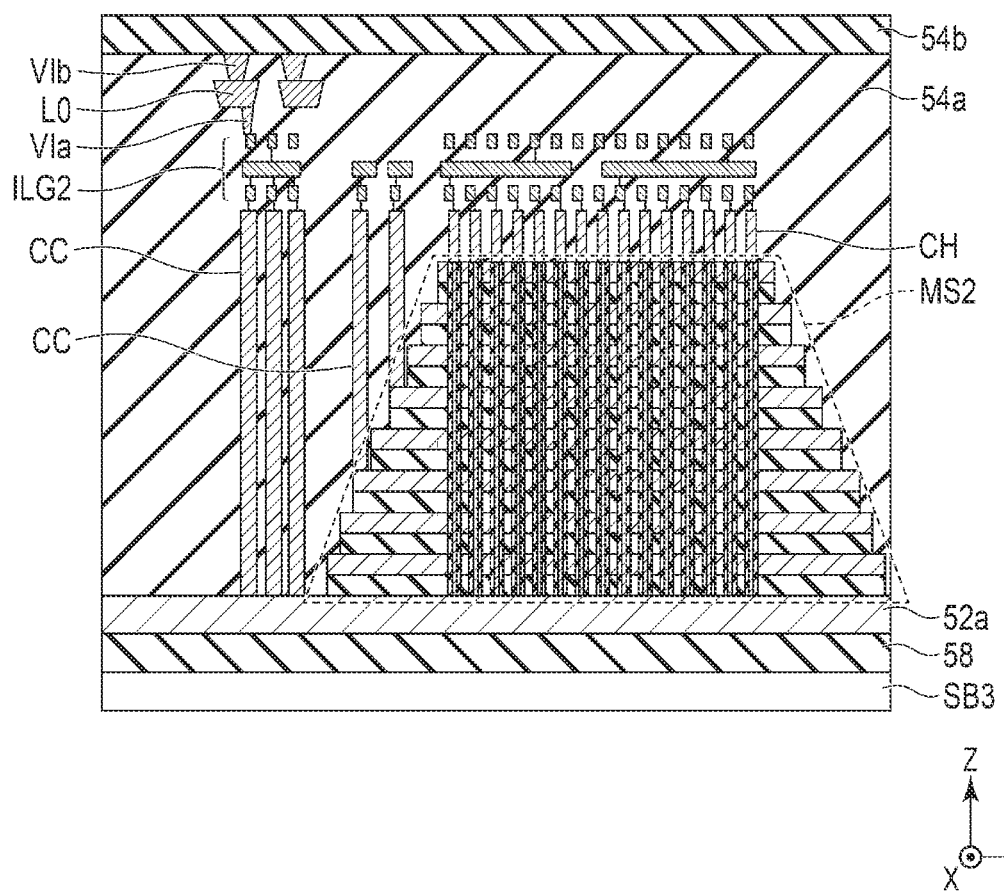
FIG. 15 is a sectional view illustrating an example of a certain step of manufacturing the semiconductor memory device according to the first embodiment.

Subsequently, as illustrated in FIG. 15, an insulator 54b is formed on the upper surface of the structure manufactured in the previous steps. The insulator 54b contains, for example, silicon oxide ($SiO_2$).

Figure 16:
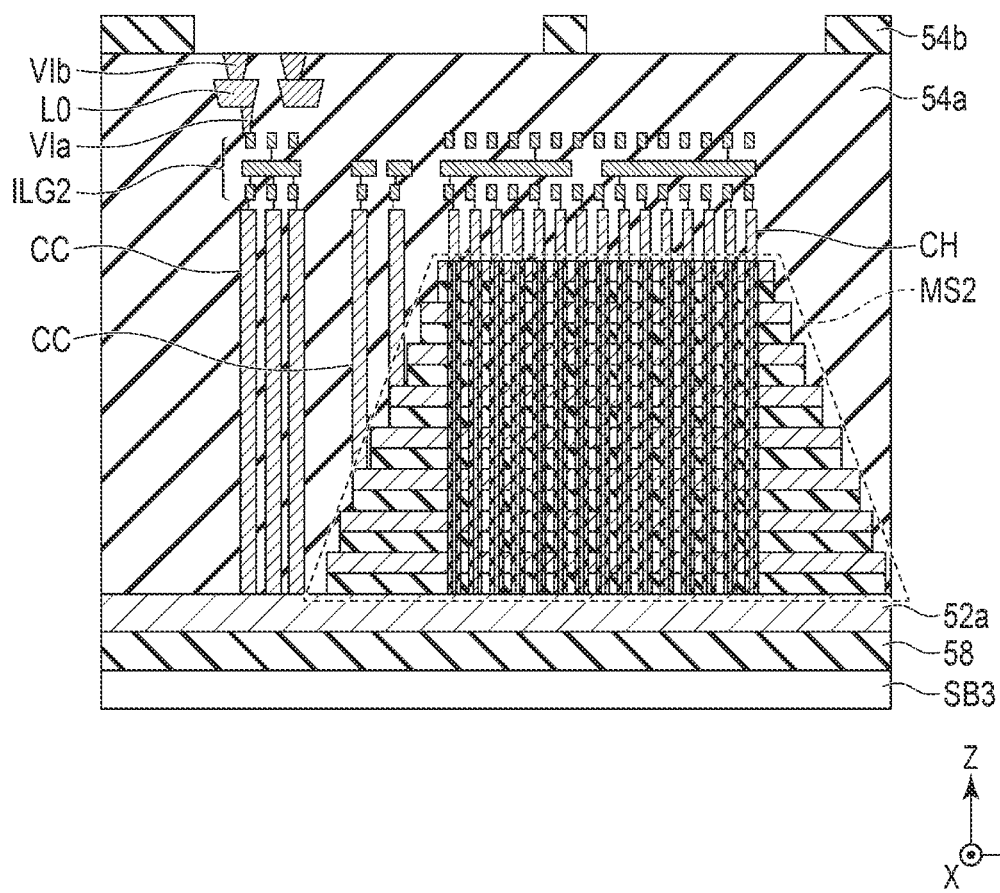
FIG. 16 is a sectional view illustrating an example of a certain step of manufacturing the semiconductor memory device according to the first embodiment.

Subsequently, as illustrated in FIG. 16, through anisotropic etching such as an RIE method, a portion, etc., in the insulator 54b, which are in contact with, for example, the contact plugs VIb, are removed.

Figure 17:
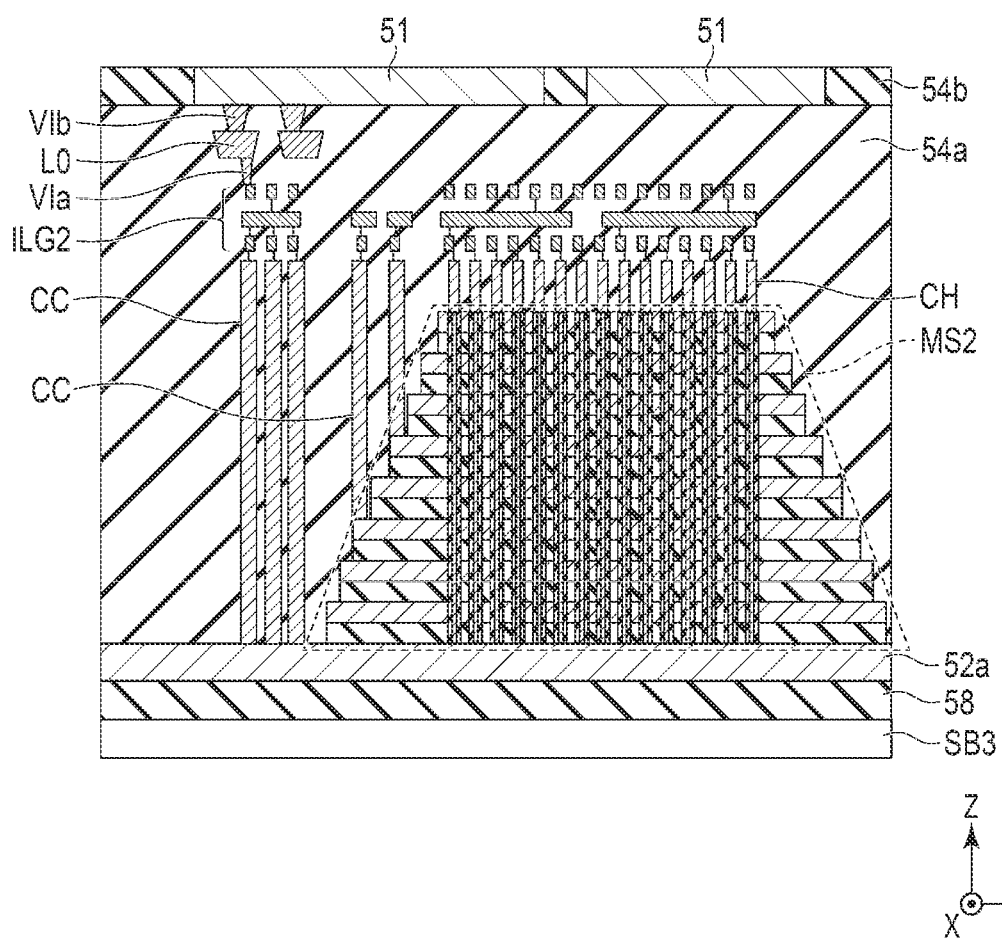
FIG. 17 is a sectional view illustrating an example of a certain step of manufacturing the semiconductor memory device according to the first embodiment.

Subsequently, as illustrated in FIG. 17, through damascene processing, the conductors 51 are formed in spaces obtained by the removal. The upper surfaces of the conductors 51 are flattened by, for example, CMP so as to be located substantially at the same position as the upper surface of the insulator 54b in the Z direction. In the damascene processing, the conductor 51a illustrated in FIG. 4 is also formed.

The conductor 51 described by using FIGS. 14 to 17 is formed by so-called single damascene processing, but the formation method of the conductor 51 is not limited thereto. For example, it is also possible to collectively form the conductor 51 together with the contact plug VIb through so-called dual damascene processing.

Figure 18:
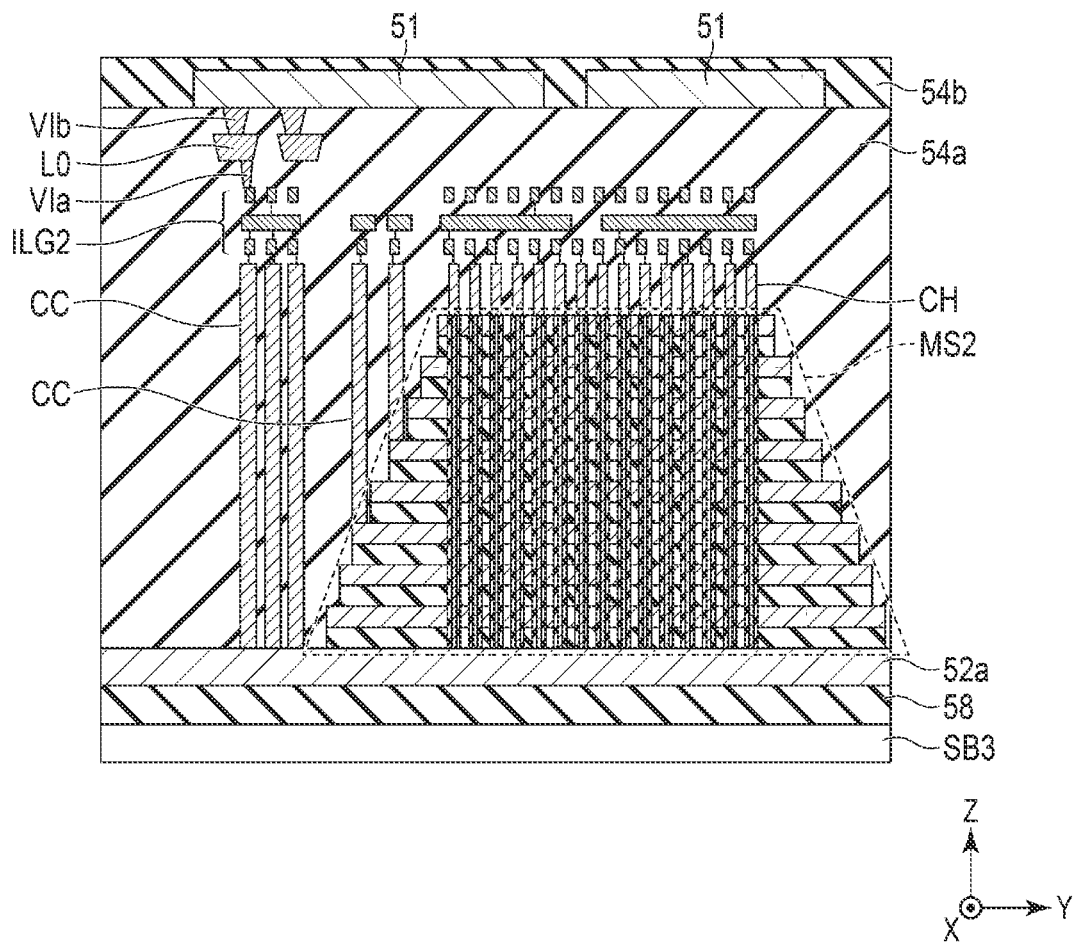
FIG. 18 is a sectional view illustrating an example of a certain step of manufacturing the semiconductor memory device according to the first embodiment.

Subsequently, as illustrated in FIG. 18, the insulator 54b is formed on the upper surface of the structure manufactured in the previous steps.

Figure 19:
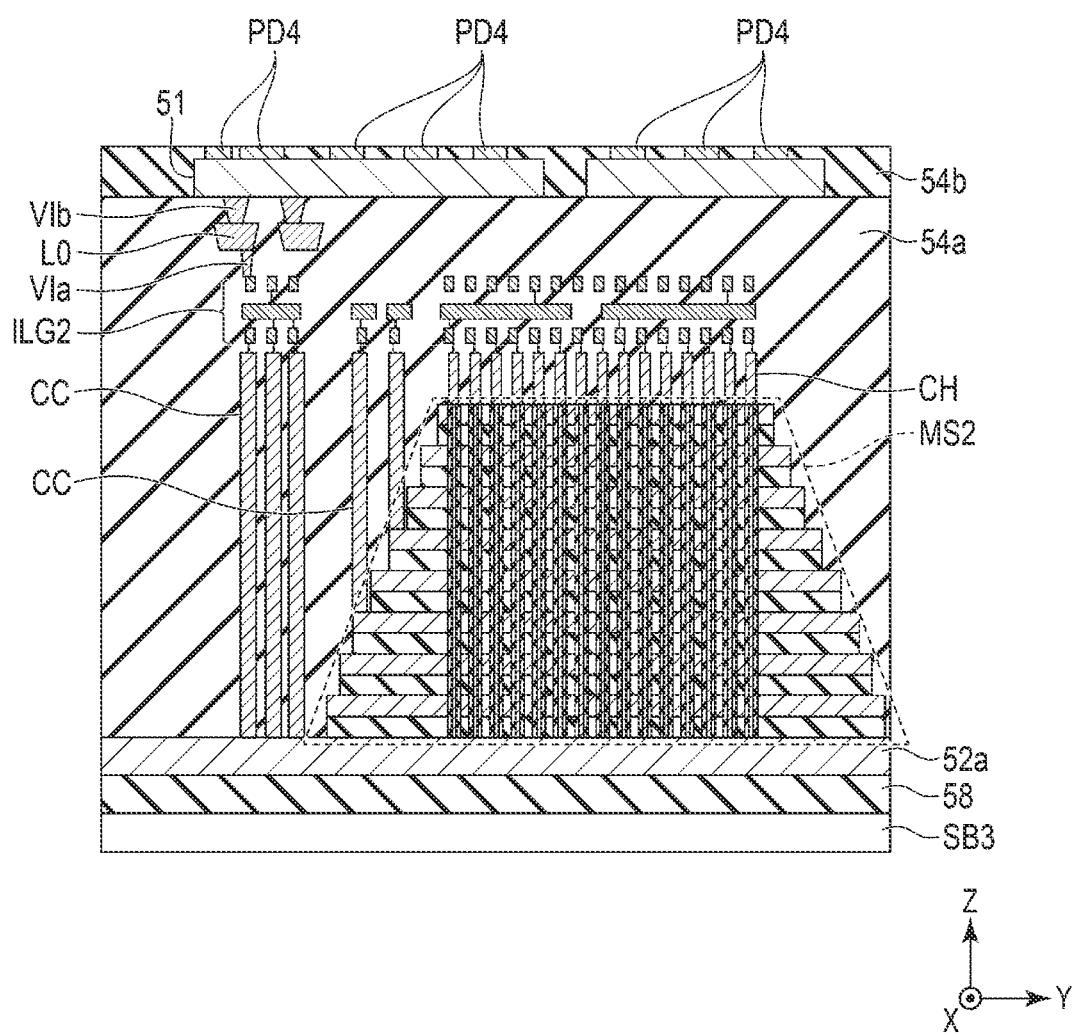
FIG. 19 is a sectional view illustrating an example of a certain step of manufacturing the semiconductor memory device according to the first embodiment.

Subsequently, as illustrated in FIG. 19, through anisotropic etching such as an RIE method and damascene processing, the plurality of conductors PD4 are formed on the upper surfaces of the conductors 51. The upper surfaces of the conductors PD4 are flattened by, for example, CMP so as to be located substantially at the same position as the upper surface of the insulator 54b in the Z direction. In this manner, the conductors PD4 illustrated in FIGS. 3 to 5 are formed.

Figure 20:
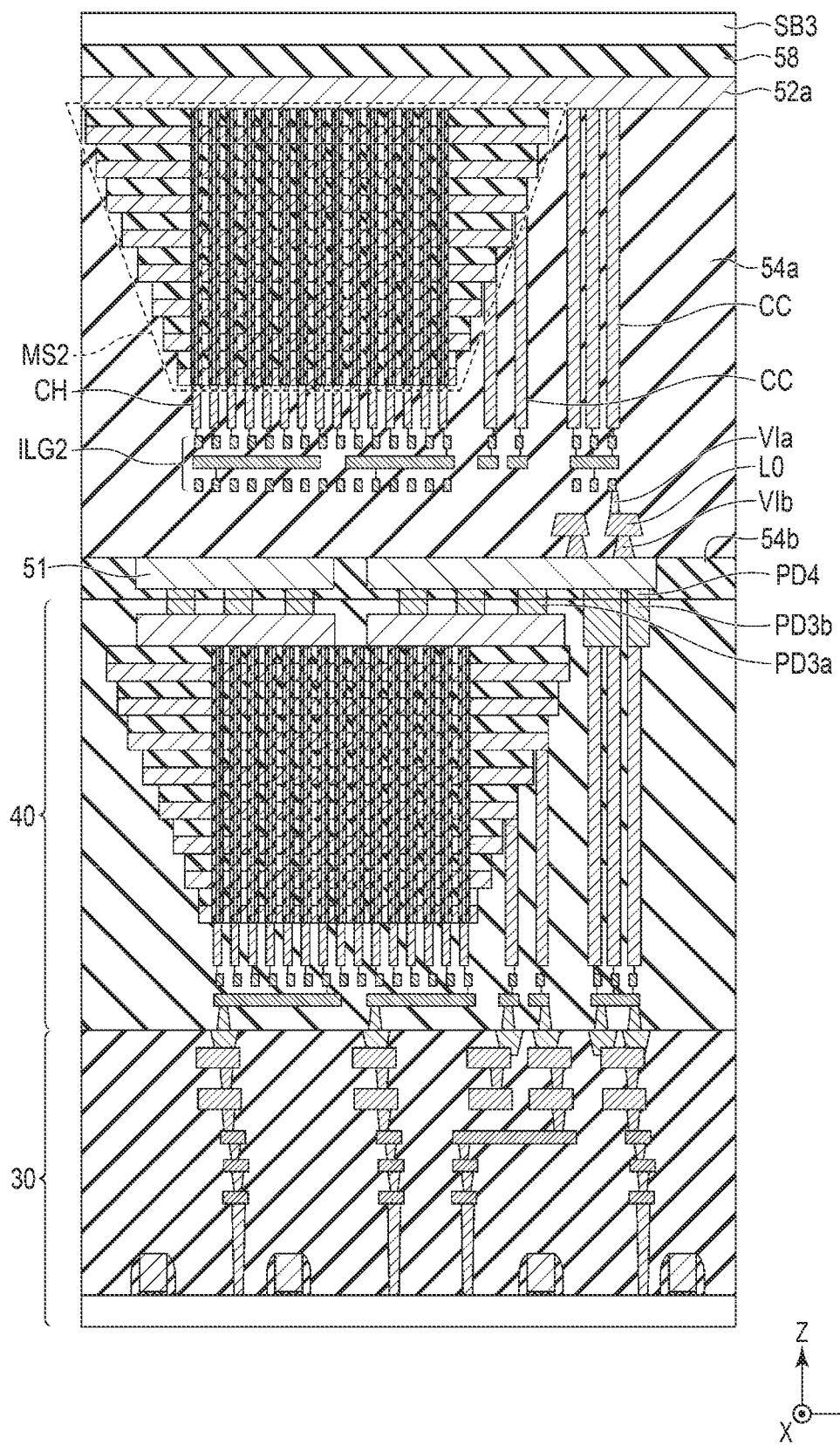
FIG. 20 is a sectional view illustrating an example of a certain step of manufacturing the semiconductor memory device according to the first embodiment.

Next, the upper surface of the structure manufactured in this manner is bonded to the upper surface of the cell chip 40 illustrated in FIG. 12, as illustrated in FIG. 20. In the bonding, for each of the conductors PD3 of the cell chip 40, any one of the conductors PD4 is brought into contact with the upper surface of the conductor PD3. Through the bonding, for example, the structure manufactured by the steps described with reference to FIGS. 13 to 19 is turned upside down.

Figure 21:
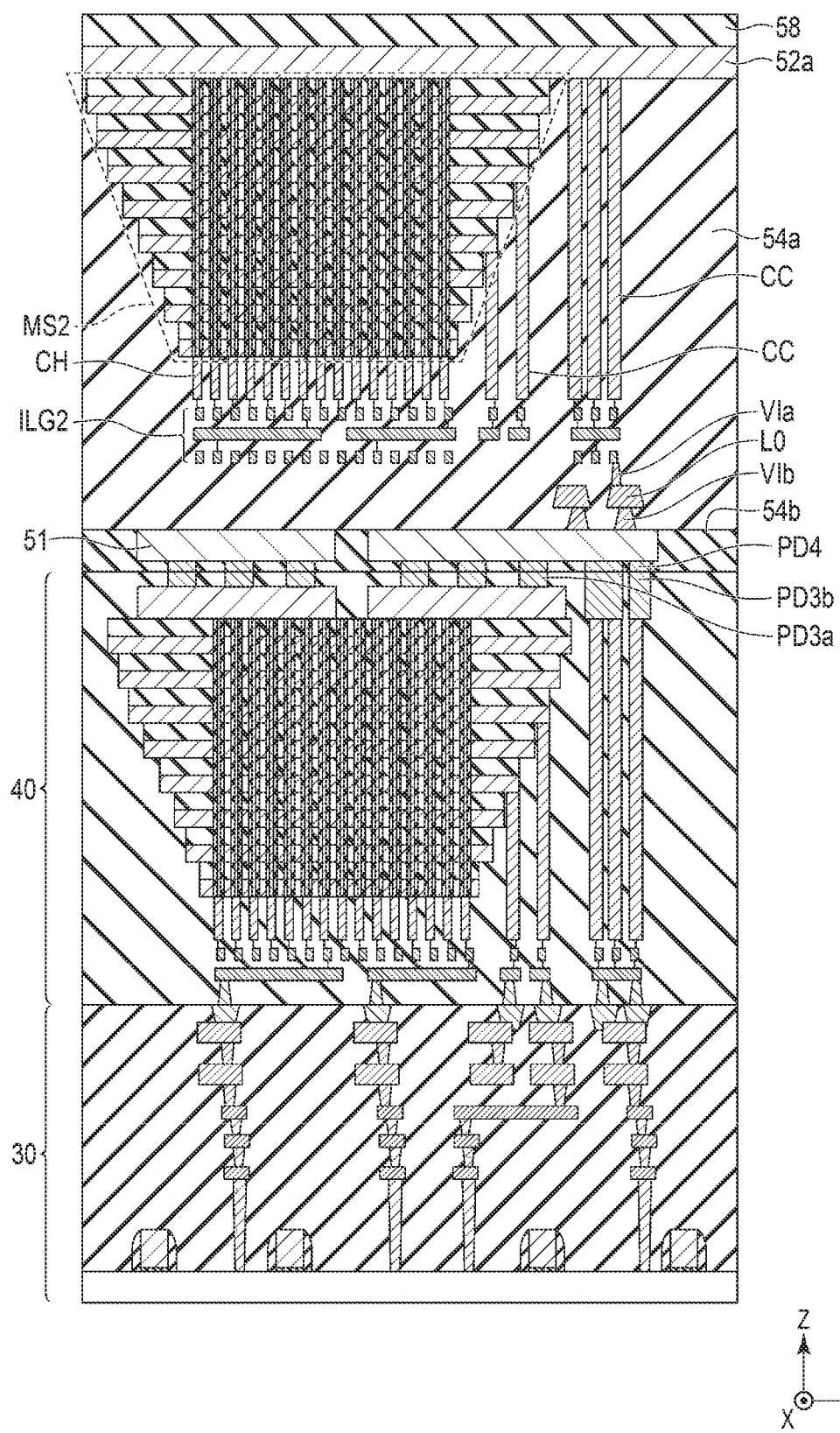
FIG. 21 is a sectional view illustrating an example of a certain step of manufacturing the semiconductor memory device according to the first embodiment.

Next, as illustrated in FIG. 21, the semiconductor substrate SB3 is removed by, for example, CMP.

Figure 22:
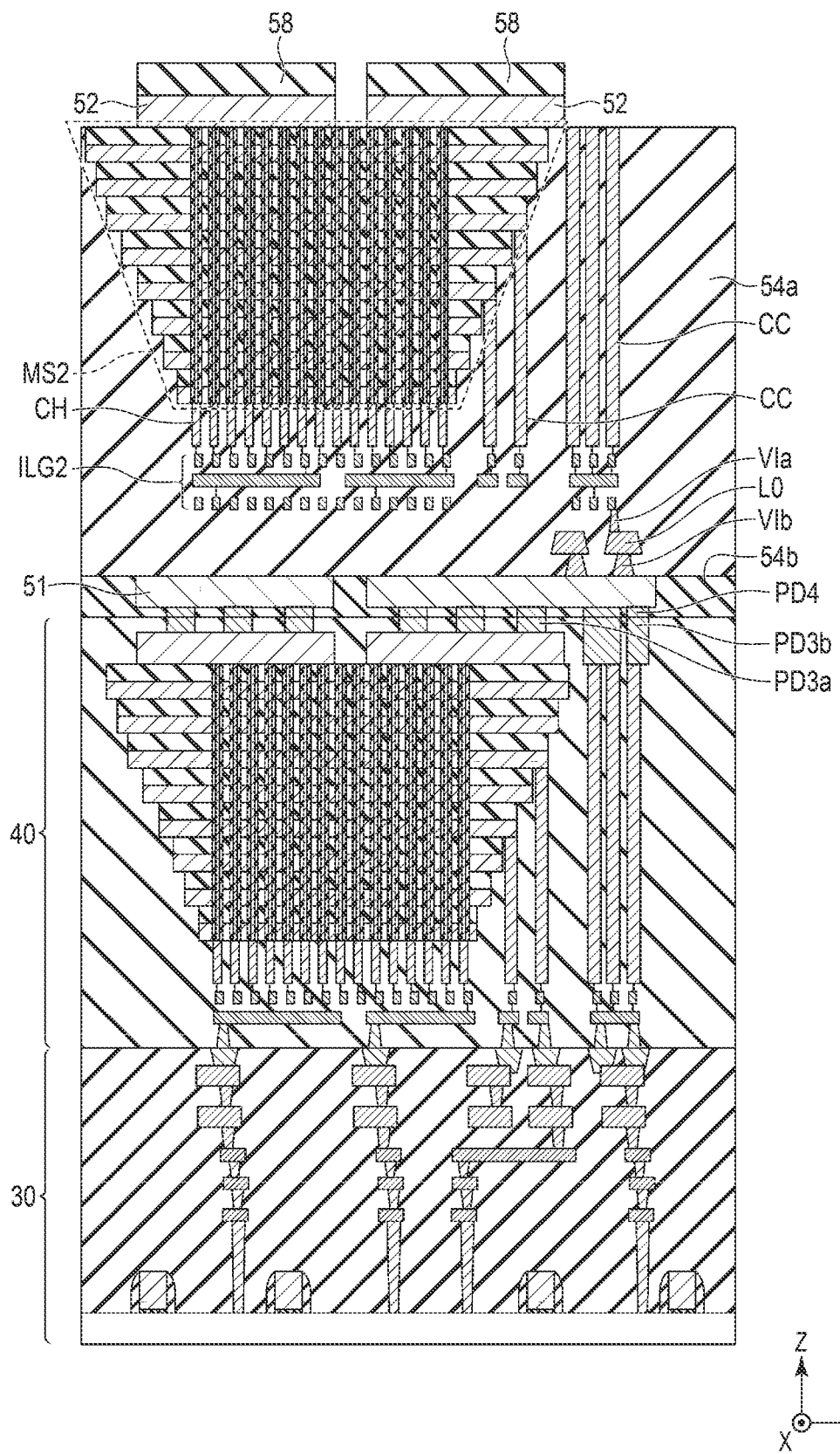
FIG. 22 is a sectional view illustrating an example of a certain step of manufacturing the semiconductor memory device according to the first embodiment.

Subsequently, as illustrated in FIG. 22, for example, an opening is formed in the insulator 58 by a lithography process, and the insulator 58 in which the opening is formed is used as a mask to perform anisotropic etching such as an RIE method so that the conductor 52a is divided for plane division. Further, a portion in the conductor 52a which is in contact with, for example, the contact plugs CC is removed. The conductor 52a after the division and the removal corresponds to the conductor 52 illustrated in FIG. 3. Each memory pillar MP2 that was in contact with a portion in the conductor 52a removed through plane division corresponds to a dummy pillar that does not include a portion used as the memory cell transistor MT. The division of the conductor 52a may be performed following the formation of the conductor 52a described with reference to FIG. 13.

In the structure manufactured by the above steps, after the removal of the insulator 58, subsequently, for example, an insulator for electrically insulating the conductors 52 from each other is formed. Then, the conductors 53 and 53a illustrated in FIGS. 3 and 4 are formed by a physical vapor deposition (PVD) method such as sputtering. Next, the insulator is formed up to a position above the upper surface of the conductor 53. The insulator formed in this manner and the insulators 54a and 54b correspond to the insulator 54 illustrated in FIGS. 3 and 4. The structure manufactured on the cell chip 40 in this manner corresponds to the cell chip 50 illustrated in FIG. 3. In this manner, the semiconductor memory device 1 described with reference to FIGS. 3 to 5 is manufactured.

[Comparative Example]

Figure 23:
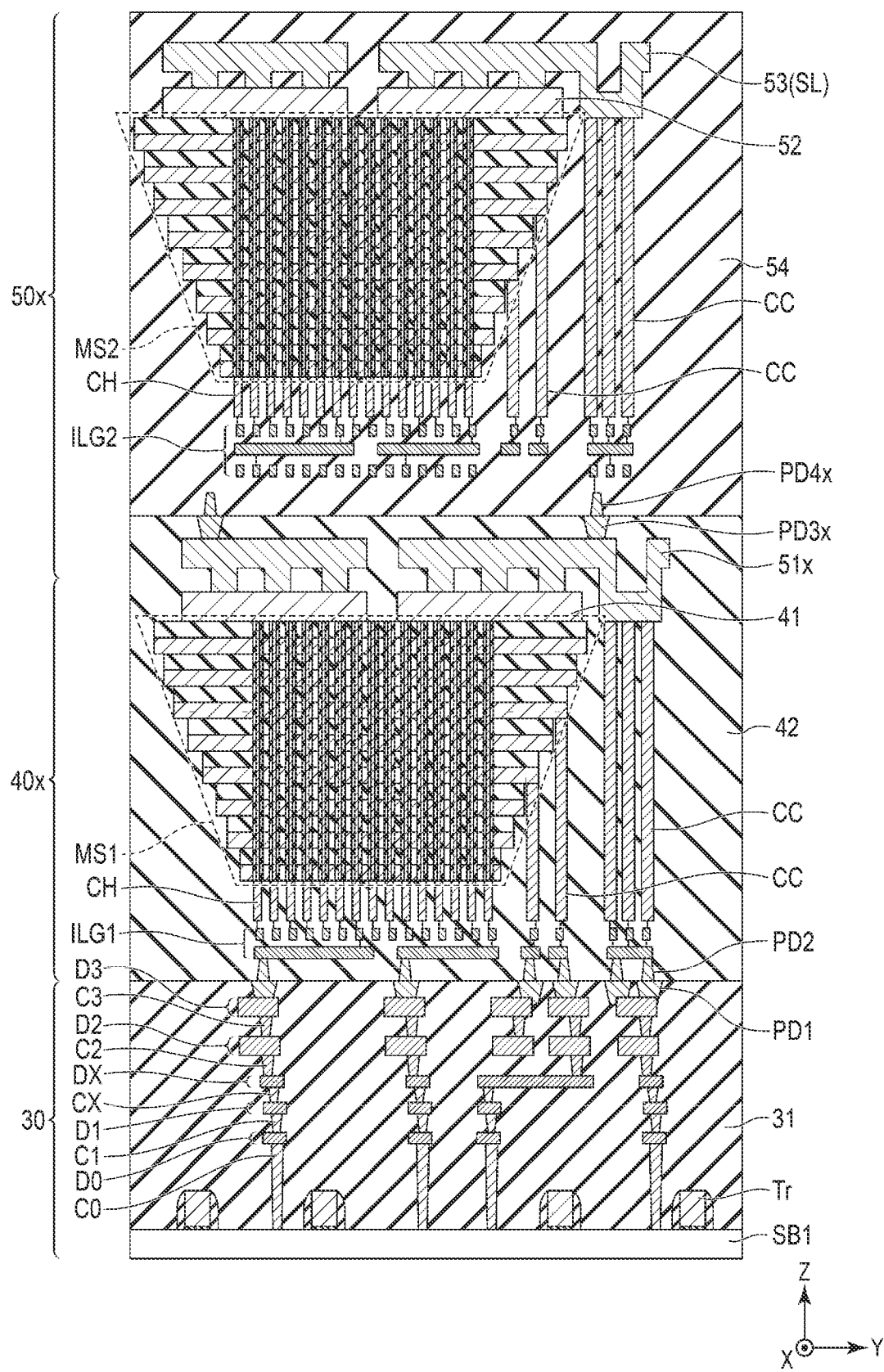
FIG. 23 is a sectional view illustrating an example of a cross-sectional structure of a semiconductor memory device according to Comparative Example of the first embodiment.

FIG. 23 is a sectional view illustrating an example of a cross-sectional structure of a semiconductor memory device according to Comparative Example of the first embodiment.

The semiconductor memory device has a structure in which the peripheral circuit chip 30, a cell chip 40x, and a cell chip 50x are bonded. The peripheral circuit chip 30, the cell chip 40x, and the cell chip 50x are sequentially provided so as to be adjacent to each other in the order of the peripheral circuit chip 30, the cell chip 40x, and the cell chip 50x along the Z direction.

The structure of the peripheral circuit chip 30 is the same as described with reference to FIG. 3.

Subsequently, the structure of the cell chip 40x will be described. The structure is a structure in which a configuration corresponding to the conductor 51 of the cell chip 50 in the example of FIG. 3 is provided in the structure of the cell chip 40 in the example of FIG. 3. More specifically, this is as follows.

Similarly to the conductor 53 in the example of FIG. 3, a conductor 51x is provided on the upper surface of the conductor 41 and the upper surface of the contact plug CC. The conductor 51x contains aluminum (Al). The conductor 51x functions as a part of, for example, the source line SL.

A conductor PD3x is provided on the upper surface of the conductor 51x. The conductor PD3x contains copper (Cu). The upper surface of the conductor PD3x forms a part of the upper surface of the cell chip 40x, and is located substantially at the same position as the upper surface of the cell chip 40x in the Z direction.

Next, the structure of the cell chip 50x will be described. The structure corresponds to the structure of the cell chip 50 in the example of FIG. 3, from which the conductor 51 is removed.

A plurality of conductors PD4x are provided on the lower surface of the cell chip 50x. More specifically, for each of the conductors PD3x, the conductor PD4x is provided to come in contact with the upper surface of the conductor PD3x. The conductor PD4x contains, for example, a metal material such as copper (Cu).

[Effect]

In manufacturing the semiconductor memory device according to Comparative Example of the first embodiment, steps to be described below are performed following the steps described with reference to FIG. 10. That is, for example, after the removal of the insulator 46, an insulator for electrically insulating the conductors 41 from each other is formed. Then, through a physical vapor deposition method such as sputtering, the conductor 51x containing aluminum (Al) is formed on the upper surface of the conductor 41, and the upper surface of the exposed contact plug CC. On the upper surface of the structure manufactured in this manner, the insulator 42 is formed, and the upper surface after the formation of the insulator 42 is flattened by, for example, CMP. Subsequently, the insulator 42 is further formed on the upper surface after the flattening, and then through anisotropic etching such as an RIE method and damascene processing, the conductor PD3x containing copper (Cu) is formed on the upper surface of the conductor 51x. The upper surface of the conductor PD3x is flattened by, for example, CMP.

Here, there is a large step on the upper surface of the conductor 51x formed by a physical vapor deposition method such as sputtering. Thus, it is difficult to perform the above flattening following the formation of the conductor 51*x*. Roll-off may occur in the outer periphery of the upper surface after the flattening, and an effective area usable as a chip can be reduced. When the conductor PD3*x* containing copper is formed on the conductor 51*x* containing aluminum, aluminum and copper can be alloyed.

Meanwhile, in manufacturing the semiconductor memory device 1 according to the first embodiment, after the steps described with reference to FIG. 10, as described with reference to FIGS. 11 and 12, for example, through damascene processing, the conductor PD3*a* is formed on the upper surface of the conductor 41, and the conductor PD3*b* is formed on the upper surface of the contact plug CC. The upper surfaces of the conductors PD3*a* and PD3*b* are flattened by, for example, CMP. The conductor 51 that fulfils the same function as the conductor 51*x* is provided on the cell chip 50 side as described with reference to FIGS. 15 to 17. The conductor 51 contains, for example, copper (Cu). As described with reference to FIGS. 18 to 20, the conductor 51 is electrically connected to the conductor 41 and the contact plug CC via the conductors PD3 and PD4.

In manufacturing the semiconductor memory device 1 according to the first embodiment, in this manner, instead of the conductor 51*x*, the conductor 51 is provided on the cell chip 50 side so that the above flattening with a high process difficulty, which follows the formation of the conductor 51*x*, is avoided. The formation of the conductor 51 on the cell chip 50 side is relatively easy because only one metal wiring layer is added to the upper surface of the structure with a relatively small step, which is manufactured by the steps described with reference to FIG. 14. That is, in manufacturing of the semiconductor memory device 1 according to the first embodiment, the number of times of CMP is substantially reduced, and the process difficulty is reduced as compared to in manufacturing of the semiconductor memory device according to Comparative Example. When the conductor 51 contains copper (Cu), the above described alloying does not occur between the conductor 51 and the conductor PD4 in contact with the conductor 51.

[Modification]

The structure of the semiconductor memory device 1 is not limited to that described with reference to FIGS. 3 to 5. Hereinafter, another example will be described. Hereinafter, differences from those described with reference to FIGS. 3 to 5 will be mainly described. The same effect as described above is also achieved by the semiconductor memory device 1 according to modifications of the first embodiment to be described below.

Figure 24:
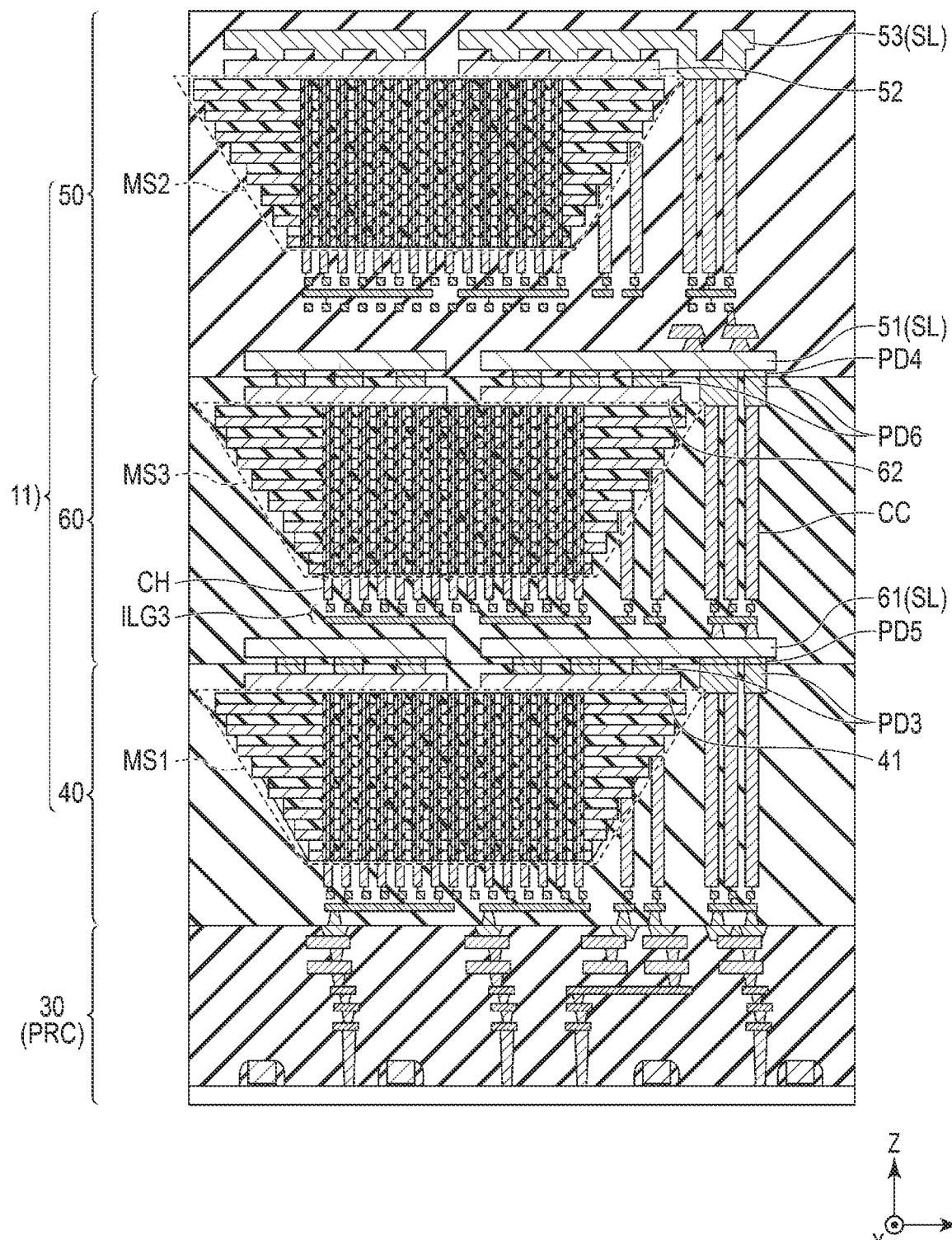
FIG. 24 is a sectional view illustrating an example of a cross-sectional structure of the semiconductor memory device according to a first modification of the first embodiment.
Figure 24:
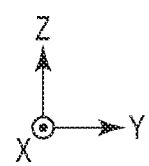

FIG. 24 is a sectional view illustrating an example of a cross-sectional structure of the semiconductor memory device 1 according to a first modification of the first embodiment.

The semiconductor memory device 1 has a structure in which the peripheral circuit chip 30, the cell chip 40, a cell chip 60, and the cell chip 50 are bonded. The structure corresponds to a structure, in which in the structure of the example of FIG. 3, the cell chip 60 is provided between the cell chip 40 and the cell chip 50. A part of the memory cell array 11 is provided in the cell chip 60 as well.

The structures of the peripheral circuit chip 30, the cell chip 40, and the cell chip 50 are the same as those in the example of FIG. 3.

The structure of the cell chip 60 will be described. The cell chip 60 is provided on the upper surface of the cell chip 40. The cell chip 60 includes a stacked body MS3 functioning as a part of the memory cell array 11 similarly to the stacked bodies MS1 and MS2.

A plurality of conductors PD5 are provided on the lower surface of the cell chip 60. A conductor 61 is provided on the upper surfaces of the plurality of conductors PD5. The conductor 61 extends in a planar shape parallel to, for example, the X direction and the Y direction. The conductor 61 contains, for example, copper (Cu). The conductor 61 functions as a part of the source line SL. The conductor PD5 and the conductor 61 have the same structures as the conductor PD4 and the conductor 51 of the cell chip 50.

The same structure as that of the cell chip 40 is provided above the conductors 61. More specifically, a metal wiring layer group ILG3, the stacked body MS3, contact plugs CH and CC, conductors 62, and conductors PD6 are provided. The conductor 62 and the conductor PD6 have the same structures as the conductor 41 and the conductor PD3 of the cell chip 40.

The cell chip 50 is provided on the upper surface of the cell chip 60. For each of the conductors PD6, any one of the conductors PD4 of the cell chip 50 is in contact with the conductor PD6.

In the above described structure, a planar metal wiring functioning as a part of the source line SL is not present in the cell chip 40, but is present in the cell chip 60 and the cell chip 50. Specifically, the conductor 61 is present in the cell chip 60, and the conductor 51 and the conductor 53 are present in the cell chip 50.

In manufacturing the semiconductor memory device 1 according to the first modification of the first embodiment, the conductor 61 and the conductor PD5 are formed in the same manner as described for the conductor 51 and the conductor PD4 of the cell chip 50, and the conductor 62 and the conductor PD6 are formed in the same manner as described for the conductor 41 and the conductor PD3 of the cell chip 40.

Figure 25:
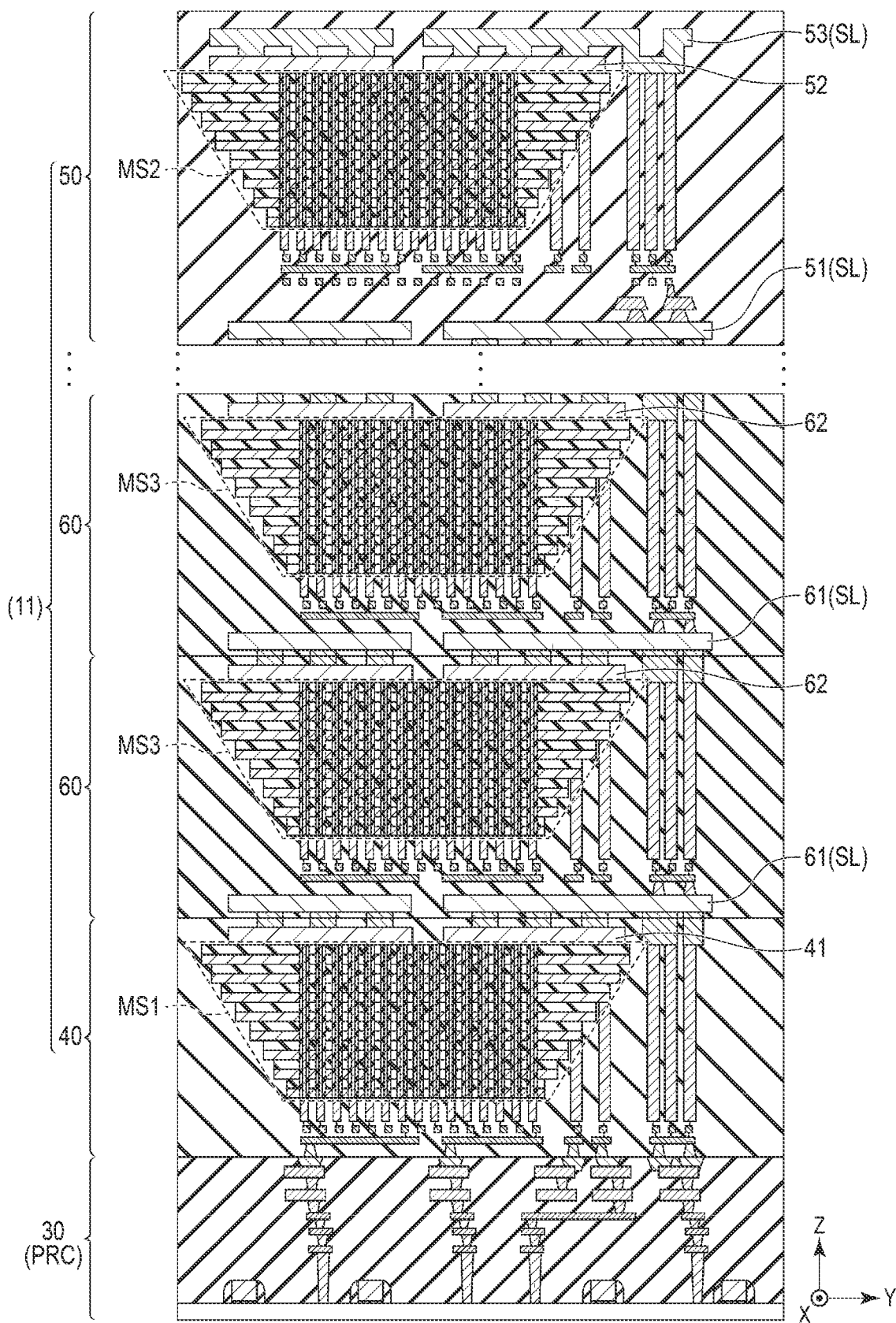
FIG. 25 is a sectional view illustrating an example of a cross-sectional structure of the semiconductor memory device according to a second modification of the first embodiment.

FIG. 25 is a sectional view illustrating an example of a cross-sectional structure of the semiconductor memory device 1 according to a second modification of the first embodiment.

The semiconductor memory device 1 has a structure in which the peripheral circuit chip 30, the cell chip 40, a plurality of cell chips 60, and the cell chip 50 are bonded. The structure corresponds to a structure, in which in the structure of the example of FIG. 24, the plurality of cell chips 60 are provided between the cell chip 40 and the cell chip 50.

In the structure, a planar metal wiring functioning as a part of the source line SL is not present in the cell chip 40, but is present in each of the cell chips 60 and the cell chip 50. Specifically, the conductor 61 is present in each of the cell chips 60, and the conductor 51 and the conductor 53 are present in the cell chip 50.

Other Embodiments

"Connection" in the present specification refers to electrical connection, and does not exclude, for example, another element intervened therebetween.

In the present specification, notations such as identical, consistent, constant, and maintain are used with the intention of including a case where an error is present in range of design when techniques described in the embodiment are implemented. The same also applies to a case where the term of "substantial" is additionally used in the notation such as "substantially the same." The notation that a certain voltage is applied or supplied is used with the intention of including both performing a control so that the voltage may be applied or supplied, and actually applying or supplying the voltage.

Further, applying or supplying a certain voltage may include applying or supplying a voltage of, for example, 0 V.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor memory device comprising:
   a first memory cell chip including:
      a plurality of first conductive layers arranged at intervals in a first direction,
      first insulators alternately arranged with respect to the plurality of first conductive layers in the first direction,
      a first semiconductor layer extending in the first direction through the plurality of first conductive layers,
      a first insulating film disposed between the first semiconductor layer and the plurality of first conductive layers,
      a first source line extending in a second direction perpendicular to the first direction to be in contact with a plural number of the first semiconductor layers and a plural number of the first insulating films, and
      a first electrode disposed in contact with an upper side of the first source line; and
   a second memory cell chip including:
      a second electrode in contact with the first electrode, and
      a second source line extending in the second direction and in contact with the second electrode.

2. The semiconductor memory device according to claim 1, wherein the second conductive layer source line contains copper (Cu).

3. The semiconductor memory device according to claim 1, wherein the second memory cell chip further includes:
   a plurality of third conductive layers arranged at intervals in the first direction;
   a third semiconductor layer extending in the first direction through the third conductive layers;
   a second insulating film disposed between the third semiconductor layer and the third conductive layers;
   a third source line extending in the second direction to be in contact with a plural number of the third semiconductor layers and a plural number of the second insulating films; and
   a fourth source line extending in the second direction and connected to at least the third source line.

4. The semiconductor memory device according to claim 3, wherein at least one of the second source line or the fourth source line contains aluminum (Al).

5. The semiconductor memory device according to claim 1, wherein
   the second source line and the first source line are electrically connected via the first electrode and the second electrode.

6. The semiconductor memory device according to claim 1, further comprising:
   a third memory cell chip including a transistor and a third electrode,
   wherein the first memory cell chip further includes a fourth electrode in contact with the third electrode.

7. The semiconductor memory device according to claim 1, wherein the second memory cell chip further includes a third electrode,
   the semiconductor memory device further includes a third memory cell chip including a fourth electrode, the fourth electrode in contact with the third electrode,
   the third memory cell chip further includes:
      a plurality of third conductive layers arranged at intervals in the first direction;
      a third semiconductor layer extending in the first direction through the third conductive layers;
      a second insulating film between the third semiconductor layer and the third conductive layers; and
      a fifth source line extending in the second direction to be in contact with a plural number of the third semiconductor layers and the third electrode, and
   the third memory cell chip further includes a sixth source line in contact with the fourth electrode.

8. The semiconductor memory device according to claim 1, wherein the semiconductor memory device is a NAND-type flash memory.

9. A semiconductor memory device comprising:
   a plurality of memory cell chips arranged in a first direction,
   wherein a lowermost one of the memory cell chips includes:
      a plurality of first conductive layers arranged at intervals in the first direction;
      a plurality of first insulators alternately arranged with respect to the plurality of first conductive layers in the first direction;
      a first semiconductor layer extending in the first direction to extend through the first conductive layers;
      a first insulating film disposed between the first semiconductor layer and the first conductive layers;
      a first source line extending in a second direction perpendicular to the first direction to be in contact with a plural number of the first semiconductor layers and a plural number of the first insulating films; and
      a first electrode disposed in contact with an upper side of the first source line, the first electrode connected to the lowermost cell memory chip, and
   an uppermost one of the memory cell chips includes:
      a second electrode connected the uppermost memory cell chip;
      a second source line in contact with the second electrode;
      a plurality of third conductive layers arranged at intervals in the first direction and disposed above the second source line;
      a second semiconductor layer extending in the first direction to extend through the third conductive layers;
      a second insulating film disposed between the third second semiconductor layer and the third conductive layers;
      a third source line extending in the second direction to be in contact with the second semiconductor layer and disposed above the third conductive layers; and
      a fourth source line extending in the second direction and connected to the third source line.

10. The semiconductor memory device according to claim 1, wherein the first source line and the second source line include silicon.

11. The semiconductor memory device according to claim 1, wherein the first insulating film includes silicon oxide.

12. The semiconductor memory device according to claim 3, wherein the second insulating film includes silicon oxide.

13. The semiconductor memory device according to claim 1, wherein the first conductive layers include at least one of copper or aluminum.

14. The semiconductor memory device according to claim 1, wherein the first memory cell chip and the second memory cell chip are bonded to each other.

15. The semiconductor memory device according to claim 7, wherein the third memory cell chip and the second memory cell chip are bonded to each other.

16. The semiconductor memory device according to claim 9, wherein adjacent ones of the plurality of memory cell chips are bonded to each other.

17. The semiconductor memory device according to claim 1, wherein the first memory cell chip further includes:
   a contact plug extending in the first direction, and
   the second source line and the contact plug are electrically connected via the first electrode and the second electrode in an area separated from the first conductive layers.

18. A semiconductor memory device comprising:
   a first memory cell chip including:
      a transistor and a plurality of first electrodes disposed over the transistor;
   a second memory cell chip including:
      a plurality of a second electrodes in contact with the first electrodes,
      a plurality of first conductive layers arranged at intervals in a first direction,
      a first semiconductor pillar extending in the first direction to extend through the first conductive layers,
      a first insulating film disposed between the first semiconductor pillar and the first conductive layers,
      a first source line extending in a second direction perpendicular to the first direction, disposed above the first conductive layers, and in contact with a plural number of the first semiconductor pillars,
      a third electrode disposed in contact with an upper side of the first source line, and
      a contact plug extending through in the first direction and connecting the second electrode and the third electrode in an area separated from the first conductive layers; and
   a third memory cell chip including:
      a fourth electrode in contact with the third electrode, and
      a second source line in contact with the fourth electrode.

19. The semiconductor memory device according to claim 18, wherein first to third memory cell chips are bonded to each other.

20. The semiconductor memory device according to claim 1, wherein the second source line of the second memory cell array chip is coupled to the first source line of the first memory cell array chip.

* * * * *